(12) United States Patent
Yap et al.

(10) Patent No.: US 11,054,598 B1
(45) Date of Patent: Jul. 6, 2021

(54) CRYOGENIC OPTICAL TRANSMITTER

(71) Applicant: HRL Laboratories, LLC, Malibu, CA (US)

(72) Inventors: Daniel Yap, Newbury Park, CA (US); Jongchan Kang, Malibu, CA (US)

(73) Assignee: HRL Laboratories, LLC, Malibu, CA (US)

( * ) Notice: Subject to any disclaimer, the term of this patent is extended or adjusted under 35 U.S.C. 154(b) by 56 days.

(21) Appl. No.: 16/681,596

(22) Filed: Nov. 12, 2019

Related U.S. Application Data

(60) Provisional application No. 62/760,557, filed on Nov. 13, 2018.

(51) Int. Cl.
| | |
|---|---|
| *H03K 3/42* | (2006.01) |
| *H03K 3/38* | (2006.01) |
| *G02B 6/43* | (2006.01) |
| *G02B 6/36* | (2006.01) |
| *G02B 6/42* | (2006.01) |

(52) U.S. Cl.
CPC .............. *G02B 6/43* (2013.01); *G02B 6/3652* (2013.01); *G02B 6/3692* (2013.01); *G02B 6/4214* (2013.01); *G02B 6/4225* (2013.01); *G02B 6/4239* (2013.01); *H03K 3/38* (2013.01); *H03K 3/42* (2013.01)

(58) Field of Classification Search
CPC ...... G02B 6/43; G02B 6/3652; G02B 6/3692; G02B 6/4214; G02B 6/4225; G02B 6/4239; H03K 3/38; H03K 3/42
See application file for complete search history.

(56) References Cited

U.S. PATENT DOCUMENTS

| | | | | |
|---|---|---|---|---|
| 5,436,451 | A * | 7/1995 | Silver | G01J 5/30 |
| | | | | 250/336.1 |
| 6,584,245 | B1 * | 6/2003 | Puzey | H04B 10/505 |
| | | | | 385/16 |
| 2018/0211158 | A1 * | 7/2018 | Shainline | G06N 3/0472 |

OTHER PUBLICATIONS

N. Harada, A. Yoshida and N. Yokoyama, "High-speed demonstration of an output interface driver for single-flux quantum systems," IEEE Transactions on Applied Superconductivity, v.12, n.3, Sep. 2002, pp. 1852-1856.

H. Suzuki, A. Inoue, T. Imamura and S. Hasuo, "A Josephson driver to interface Josephson junctions to semiconductor transistors," Technical Digest 1988 Intl. Meeting on Electron Devices IEDM-88, pp. 290-293.

(Continued)

*Primary Examiner* — Dinh T Le
(74) *Attorney, Agent, or Firm* — Ladas & Parry

(57) ABSTRACT

An optical transmitter includes a superconducting driver circuit including at least one Josephson junction, the superconducting driver circuit having a voltage output and having a connection to a circuit ground, a first bias circuit coupled to the voltage output of the superconducting driver circuit, a second bias circuit, wherein the second bias circuit establishes a positive bias voltage relative to the circuit ground, and an electro-optic device having a first end and a second end, wherein the first end of the electro-optic device is coupled to the voltage output of the superconducting driver circuit, and wherein the second end of the electro-optic device is coupled to the second bias circuit.

27 Claims, 19 Drawing Sheets

(56) References Cited

OTHER PUBLICATIONS

T. Ortlepp, S. R. Whiteley, L. Zheng, X. Meng and T. Van Duzer, "High-speed hybrid superconductor-to-semiconductor interface circuit with ultra-low power consumption," IEEE Transactions on Applied Superconductivity, v.23, n.3, Jun. 2013, p. 1400104.
H. Nakagawa, E. Sogawa, S. Kosaka, S. Takada and H. Hayakawa, "Operating characteristics of Josephson four-junction logic (4JL) gate," Japanese Journal of Applied Physics, v.21, n.4, Apr. 1982, pp. L198-L200.
T. Ortlepp, L. Zheng, S. R. Whiteley and T. Van Duzer, "Design guidelines for Suzuki stacks as reliable high-speed Josephson voltage drivers," Superconductor Science and Technology, v.26 (2013), p. 035007.
O. A. Mukhanov, S. V. Rylov, D. V. Galdarenko, N. B. Dubash and V. V. Borzenets, "Josephson output interfaces for RFSQ circuits," IEEE Transactions on Applied Superconductivity, v.7, n.2, Jun. 1997, pp. 2826-2831.
T. Ortlepp, et al, "Superconductor-to-semiconductor interface circuit for high data rates," IEEE Transactions on Applied Superconductivity, v.19, n.1, Feb. 2009, pp. 28-34.
N. Harada, N. Yoshikawa, A. Yoshida and N. Yokoyama, "Josephson latching driver with a low bit-error rate," IEEE Transactions on Applied Superconductivity, v.14, n.4, Dec. 2004, pp. 2031-2036.

\* cited by examiner

CRYOGENIC OPTICAL TRANSMITTER

CROSS REFERENCE TO RELATED APPLICATIONS

This application is related to and claims the benefit of U.S. Provisional Patent Application No. 62/760,557, filed on Nov. 13, 2018, which is incorporated herein by reference as though set forth in full.

STATEMENT REGARDING FEDERAL FUNDING

None

TECHNICAL FIELD

This disclosure relates to optical transmitters.

BACKGROUND

In the prior art, superconducting circuits have not been used to drive or control a light-emitting or light-modulating electro-optic device. Instead, prior art electro-optic devices have been controlled by semiconductor electronic circuits rather than by a superconducting circuit.

The power consumption of a superconducting circuit can be much lower than the power consumption of a semiconductor circuit, even when both circuits are operated at the same temperature such as 4 degrees Kelvin. However, the output voltage swing achieved by known superconducting Josephson-junction based circuits is quite low and is generally below 150 mV, and that output voltage swing is lower if the modulation frequency of the voltage is higher. For example, the achieved voltage swing may be 10 mV at a modulation frequency corresponding to a non-return-to-zero (NRZ) data rate of 10 Gb/s but the achieved voltage swing may be 60 mV at a modulation frequency corresponding to a NRZ data rate of 1 Gb/s.

An electro-optic (EO) device such as a laser diode, a light-emitting diode, an electro-optic modulator, an electro-absorption modulator, or a transistor-laser can require a DC bias voltage that is larger than the voltage swing needed to modulate the light produced from that electro-optic device. When operated at a cryogenic temperature such as 4 degrees Kelvin (4K), the modulation voltage swing of a device such as a laser diode may be less than 50 mV, and possibly even less than 5 mV, although the DC bias voltage required for the device is more than 0.5 volt and possibly even more than 1 or 2 volts. With this relatively small voltage swing, the current through the laser diode can be modulated from near zero to some substantial value such as 0.1-0.2 mA or maybe 1.0 mA. The prior art configurations for superconducting driver circuits may require the output voltage swing of that driver circuit to be comparable to the DC bias voltage, since the prior art teaches that the electro-optic device is connected to the same common or ground point as the driver circuit. But for a forward-biased diode such as the laser diode, the forward voltage should be larger than the "turn-on" voltage of the diode for there to be substantial current through the device. A driver circuit that supplies a voltage swing from 0 Volt to 50 milli-Volts would produce insignificant modulation of the light produced by a typical laser diode connected to the driver circuit according to prior art configurations.

FIGS. 1A and 1B show an example of a prior art latching superconducting driver circuit and corresponding output waveform, respectively, for the circuit that accepts as one of its inputs a pattern of single-flux-quantum (SFQ) pulses 10, as described in Reference [1], below, which is incorporated herein by reference. The pulses 10 may have a width of approximately 1-2 ps and an amplitude of approximately 0.5-1 mV. The pattern of binary data typically may have a data rate of 1 Gbps to 10 Gbps to even 50 Gbps. There is a need to transmit data from the cryogenic (typically 4 Kelvin) environment to room temperature, for additional processing. The prior art driver circuit can produce an output "pulse" 12 for each input SFQ pulse 10, with that output being reset by an alternating current (AC) bias waveform 14 that also is supplied as a second input to the driver circuit. The driver circuit produces a "high" voltage, 10 mV in this example, at its output port whenever an input SFQ pulse 10 is supplied to its control input and the bias current 14 is above a certain value. The output voltage 12 is reset to zero when the bias current 14 returns to a value below a certain minimum value. The high output voltage is achieved in the prior art by stacking multiple Josephson junctions electrically in series. Each Josephson junction is indicated by an X 16 in the circuit drawing of FIG. 1A. Starting from an initial state in which the output voltage of this driver circuit is close to zero with no current supplied via the bias waveform, the Josephson junctions in the double stack, J2 through J9 and J10 through J17, as shown in FIG. 1A, conduct the applied bias current in their superconducting state, with essentially zero voltage drop across them and also zero voltage at the output port of the circuit. If an input pulse is applied while there still is substantial bias current, first the junction J2, then the set of junctions J10 through J17 and then the set of junctions J3 through J9 switch to their resistive state. The output voltage rises to a value that is proportional to the number of series-connected junctions that are stacked together. The output remains at that value until the bias current is reduced and returns to being approximately zero when the bias current is below a minimum value.

The prior art latching driver circuit of FIG. 1A is an example of a superconducting amplifier configuration known as a Suzuki stack, as described in Reference [2], below, which is incorporated herein by reference.

FIG. 2 shows another example of a prior art Suzuki stack driver circuit and gives more detail on the resistive biasing elements in that circuit, as described in Reference [3], below, which is incorporated herein by reference. In this example, the input control signal to the stack is supplied through a four-Josephson-junction logic (4JL) gate 20 shown in FIG. 2, as described in Reference [4], below, which is incorporated herein by reference. The output 22 of the driver circuit is shown as being connected through a resistor inductor capacitor (RLC) circuit 24 to an output port 26, to which a subsequent device or circuit can be connected. This driver circuit is connected directly through a large bias resistor 28 to the bias supply 30 that provides the AC bias waveform. The bias resistance 28, which is 750 Ohms in the example shown in FIG. 2, should be sufficiently large to ensure that the performance of the driver circuit is not degraded by the presence of what might be connected at the output 26. For example, a bias resistance of 200 Ohms may be sufficient if a relatively low-current load is connected at the output port, as described in Reference [5], below, which is incorporated herein by reference. However, a larger bias resistance is needed if more and more current must be conducted through the additional circuits and devices connected at the output port, such as if the same bias supply is provided to multiple Suzuki-stack driver circuits in parallel, as described in Reference [5], below, which is incorporated herein by reference. The RLC circuit 24 at the output of the driver circuit may be used to electrically match the driver circuit output to the subsequent circuit or device or to a transmission line that connects the driver circuit to that subsequent device or circuit. To maintain stability of the driver circuit, it has been suggested that the maximum current through the load should be much less than the critical current of the Josephson junctions 16 in the stacks and preferably is approximately one half that critical current, as described in Reference [5], below. Thus, the overall resistance of the load and the output matching circuit constrains the output voltage that is needed and thus the number of Josephson junctions that must be stacked in series for the driver circuit, which also constrains the data-modulation rate that can be achieved.

FIGS. 3A and 3B show yet another prior art superconducting driver circuit 33 that has its bias current supplied by a direct current (DC) bias voltage source 32 rather than as an AC waveform. For this driver circuit 33, the Josephson junctions are arranged in pairs that are connected as loops often known as superconducting quantum-interference devices (SQUIDs), as described in Reference [6], below, which is incorporated herein by reference. Multiple SQUID loop units 38 are connected together in series, forming a stack, with the DC bias supplied to one end of the stack, the high voltage output 39, and the common or ground connection 34 of the circuit placed at the other end of the stack. For the example shown, each SQUID loop unit 38 comprises a pair of the successive pairs of SQUIDs that are controlled by a "SQUID control amplifier", as shown in FIG. 3A. Groups of several SQUID control amplifiers may be fed in series by an input signal, which feeds multiple groups in parallel, as illustrated in FIG. 3B. This combination of parallel and series feeding of the input signal, through Josephson transmission line amplifiers indicated in FIG. 3B by the letter J in a triangle, increases the response speed of the driver circuit. The input signal 35 for this example is produced by an SFQ-to-dc converting circuit 36 that is controlled by two sets of SFQ input pulses 37.

FIGS. 4A and 4B show examples of prior art non-superconducting devices that have been connected to the output of a superconducting driver circuit. FIG. 4A shows a connection between a superconducting driver circuit 40 and a semiconductor transistor 41, as described in Reference [7], below, which is incorporated herein by reference. In this case, an AC-coupling capacitor 42 is placed between the output of the superconducting driver circuit 40 and the base-emitter diode junction of the transistor 41 through its base terminal 45. The bias circuit for transistor 41 is not shown in this figure but would be connected to either the collector terminal 46 or the emitter terminal 47 of transistor 41, with the other terminal (either emitter 47 or collector 46) being connected to a common circuit ground. The alternating current (AC) coupling, through capacitor 42, provides the necessary direct current (DC) electrical isolation between the bias circuit for transistor 41 and the superconducting driver circuit 40.

FIG. 4B shows a connection between a superconducting driver circuit 43 and the gate terminal 48 of a source-grounded depletion-mode high-electron-mobility transistor (D-HEMT) 44, as described in Reference [2], below. The gate-to-source input of the HEMT 44 presents a capacitive load to the driver circuit 43. Note that the transistor 44 has a different direct current (DC) bias current and different bias circuit from the bias circuit and bias current of the superconducting driver circuit 43. The bias circuit that supplies the output for transistor 44 is connected to drain terminal 49a of the HEMT 44, with source terminal 49b of HEMT 44 connected to the circuit ground. The capacitive input via terminal 48 of the HEMT 44 isolates the DC bias current for the HEMT 44 from the superconducting driver circuit 43. The output matching circuit 24 shown in FIG. 2 is useful for controlling the momentary output current waveform delivered to this transistor to charge or discharge its gate capacitance, as described in Reference [5], below.

It should be noted that in the prior art shown in FIGS. 4A and 4B one of the terminals of the transistor 41 (collector 46 or emitter 47), or one of the terminals of the HEMT 44 (source 49b or drain 49a) is connected to ground.

As discussed above, there is no prior art of a superconducting driver circuit having its output coupled directly to an electro-optic device. The prior art examples are of a superconducting driver circuit being coupled to a transmission line, to a bipolar transistor or to a field-effect transistor. When a prior art superconducting driver circuit is coupled to the input of a transistor, such as a base-emitter diode junction, there is no direct current flow through both the Josephson junctions of the superconducting driver circuit and the forward-biased junction of a semiconductor diode or transistor, as described above with reference to FIG. 4A. Instead, it is a portion of the current from the bias input of the driver circuit that flows through the forward-biased junction of the semiconductor transistor of the prior art examples.

REFERENCES

The following references are incorporated herein by reference as though set forth in full.

[1] N. Harada, A. Yoshida and N. Yokoyama, "High-speed demonstration of an output interface driver for single-flux quantum systems," IEEE Transactions on Applied Superconductivity, v. 12, n. 3, September 2002, pp. 1852-1856.

[2] H. Suzuki, A. Inoue, T. Imamura and S. Hasuo, "A Josephson driver to interface Josephson junctions to semiconductor transistors," Technical Digest 1988 Intl. Meeting on Electron Devices IEDM-88, pp. 290-293.

[3] T. Ortlepp, S. R. Whiteley, L. Zheng, X. Meng and T. Van Duzer, "High-speed hybrid superconductor-to-semiconductor interface circuit with ultra-low power consumption," IEEE Transactions on Applied Superconductivity, v. 23, n. 3, June 2013, p. 1400104.

[4] H. Nakagawa, E. Sogawa, S. Kosaka, S. Takada and H. Hayakawa, "Operating characteristics of Josephson four-junction logic (4JL) gate," Japanese Journal of Applied Physics, v. 21, n. 4, April 1982, pp. L198-L200.

[5] T. Ortlepp, L. Zheng, S. R. Whiteley and T. Van Duzer, "Design guidelines for Suzuki stacks as reliable high-speed Josephson voltage drivers," Superconductor Science and Technology, v. 26 (2013), p. 035007.

[6] O. A. Mukhanov, S. V. Rylov, D. V. Galdarenko, N. B. Dubash and V. V. Borzenets, "Josephson output interfaces for RFSQ circuits," IEEE Transactions on Applied Superconductivity, v. 7, n. 2, June 1997, pp. 2826-2831.

[7] T. Ortlepp, et al, "Superconductor-to-semiconductor interface circuit for high data rates," IEEE Transactions on Applied Superconductivity, v. 19, n. 1, February 2009, pp. 28-34.

[8] N. Harada, N. Yoshikawa, A. Yoshida and N. Yokoyama, "Josephson latching driver with a low bit-error rate," IEEE Transactions on Applied Superconductivity, v. 14, n. 4, December 2004, pp. 2031-2036.

What is needed is a superconducting driver circuit that can be used to drive or control a light emitting or light modulating electro-optic device. The embodiments of the present disclosure answer these and other needs.

SUMMARY

In a first embodiment disclosed herein, an optical transmitter comprises a superconducting driver circuit comprising at least one Josephson junction, the superconducting driver circuit having a voltage output and having a connection to a circuit ground, a first bias circuit coupled to the voltage output of the superconducting driver circuit, a second bias circuit, wherein the second bias circuit establishes a positive bias voltage relative to the circuit ground, and an electro-optic device having a first end and a second end, wherein the first end of the electro-optic device is coupled to the voltage output of the superconducting driver circuit, and wherein the second end of the electro-optic device is coupled to the second bias circuit.

In another embodiment disclosed herein, an optical transmitter comprises a superconducting driver circuit comprising at least one Josephson junction, the superconducting driver circuit having a voltage output and having a connection to a circuit ground, a first bias circuit coupled to the voltage output of the superconducting driver circuit, a second bias circuit, wherein the second bias circuit establishes a negative bias voltage relative to the circuit ground, and an electro-optic device having a first end and a second end, wherein the first end of the electro-optic device is coupled to the voltage output of the superconducting driver circuit, and wherein the second end of the electro-optic device is coupled to the second bias circuit.

In yet another embodiment disclosed herein, a method of providing an optical transmitter comprises providing a superconducting driver circuit comprising at least one Josephson junction, the superconducting driver circuit having a voltage output and having a connection to a circuit ground, providing a first bias circuit coupled to the voltage output of the superconducting driver circuit, providing a second bias circuit, and providing an electro-optic device having a first end and a second end, wherein the first end of the electro-optic device is coupled to the voltage output of the superconducting driver circuit, and wherein the second end of the electro-optic device is coupled to the second bias circuit.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

In contrast to the prior art described above, the present disclosure describes an optical transmitter that directly connects the output of a superconducting driver circuit to the junction of a light-emitting diode, a laser diode, the base-emitter junction of a transistor-laser, or a PN-junction-modulated optical modulator that may be operated forward-biased. At low cryogenic temperatures such as 4K (4 Kelvin), the modulation current and the average current of these electro-optic devices can be very low, much lower than the critical current of the Josephson junctions in the driver circuit. These low currents allow the modulation of the electro-optic device to not hamper the operation of the driver circuit. The current of the electro-optic device swings between a value close to zero and a finite value that is low compared to the Josephson junction critical current. For some electro-optic devices, the current through the device can be smaller than the minimum current below which the state of the Josephson junction would be reset from being resistive to being superconducting. Thus, having the additional current from the electro-optic device pass through the stack of Josephson junctions does not hinder the switching of those junctions between superconducting and resistive states.

Figures 1A, 1B:
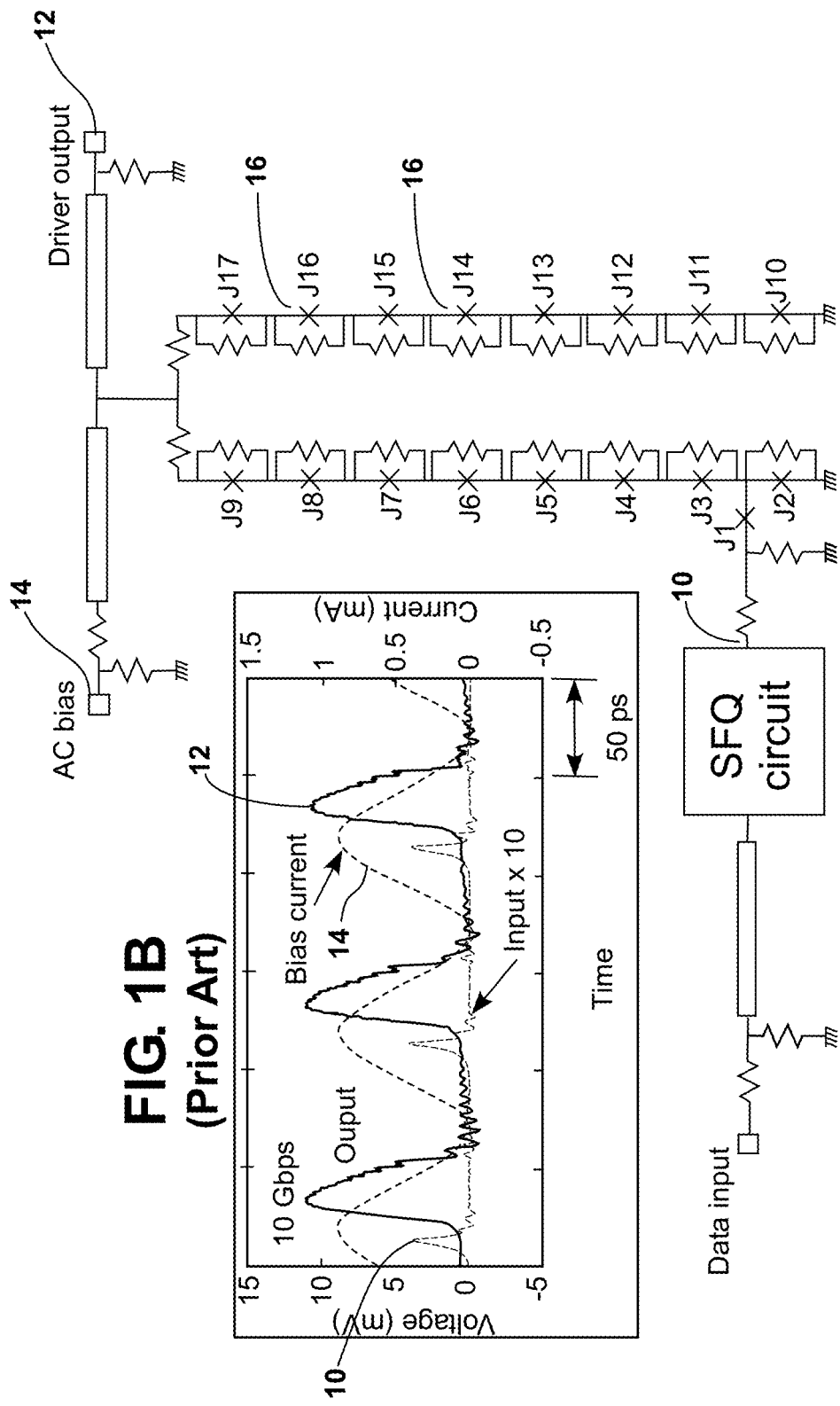
FIG. 1A shows an example latching driver circuit having a pair of stacked Josephson junctions and FIG. 1B shows the output waveform in accordance with the prior art.
Figure 2:
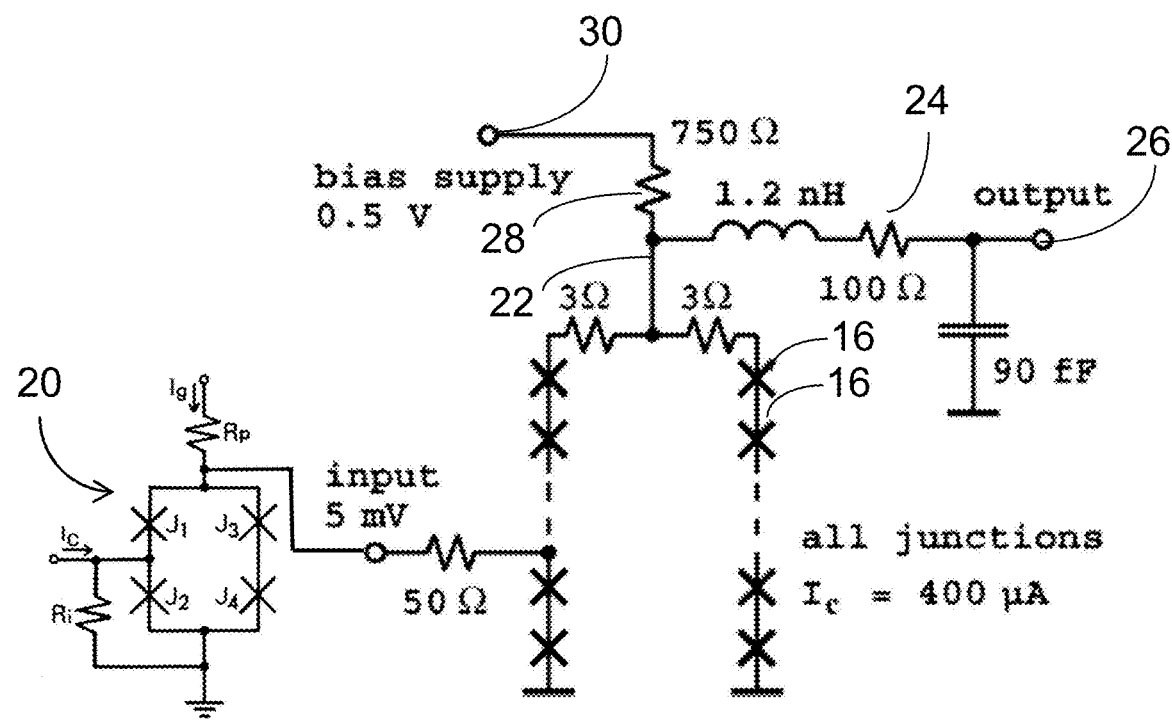
FIG. 2 shows an example latching driver circuit preceded by a 4-junction logic gate in accordance with the prior art.
Figure 3A:
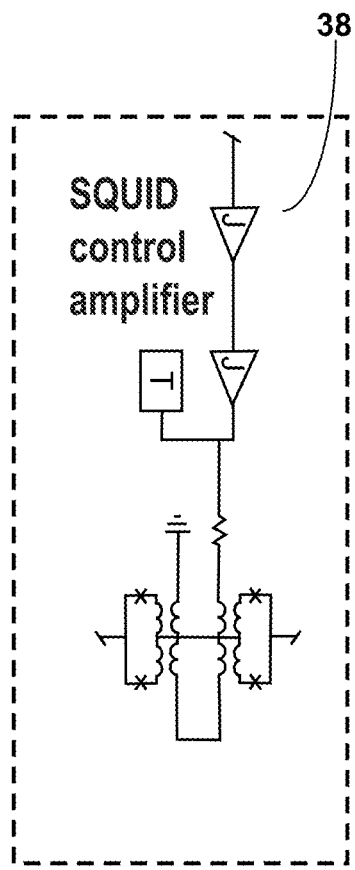
FIG. 3A shows a SQUID control amplifier and FIG. 3B shows a superconducting driver circuit having a stack of SQUID loops in accordance with the prior art.
Figure 3B:
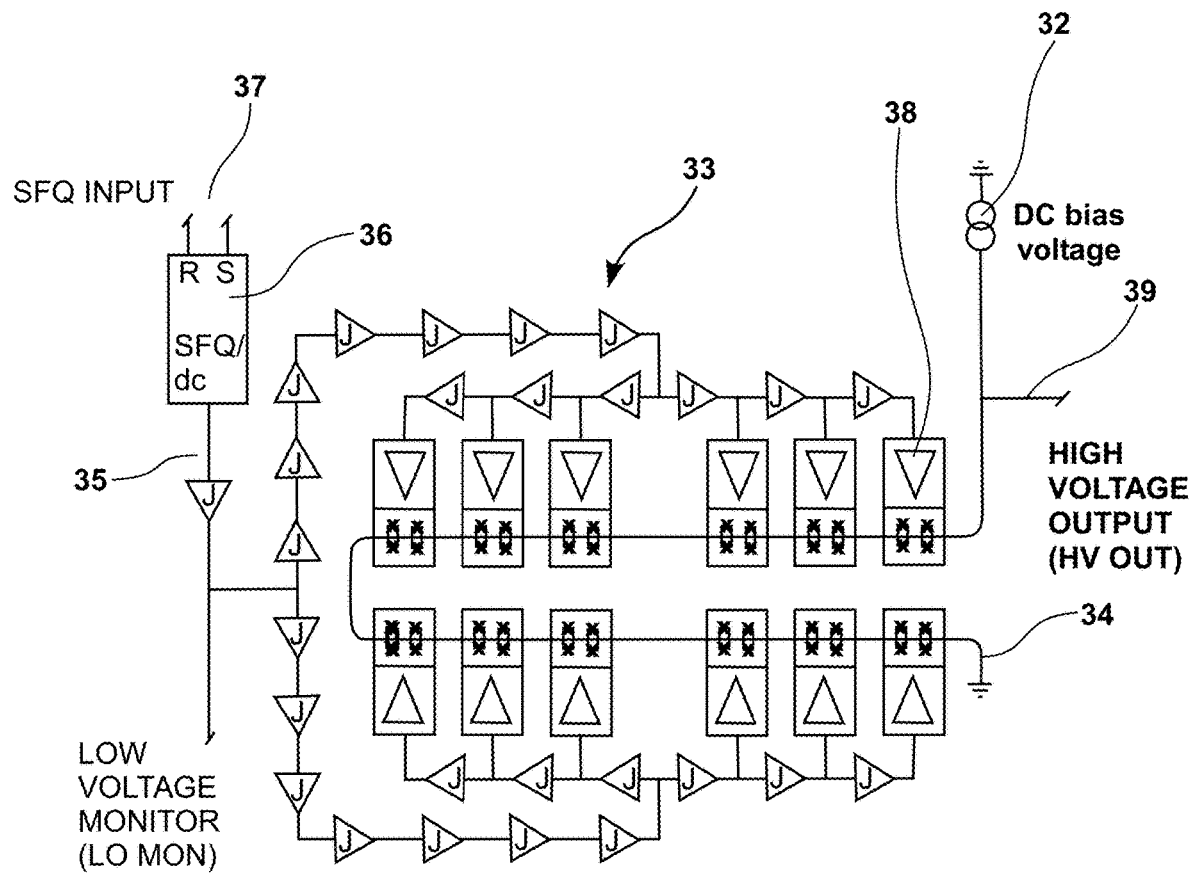
Figures 4A, 4B:
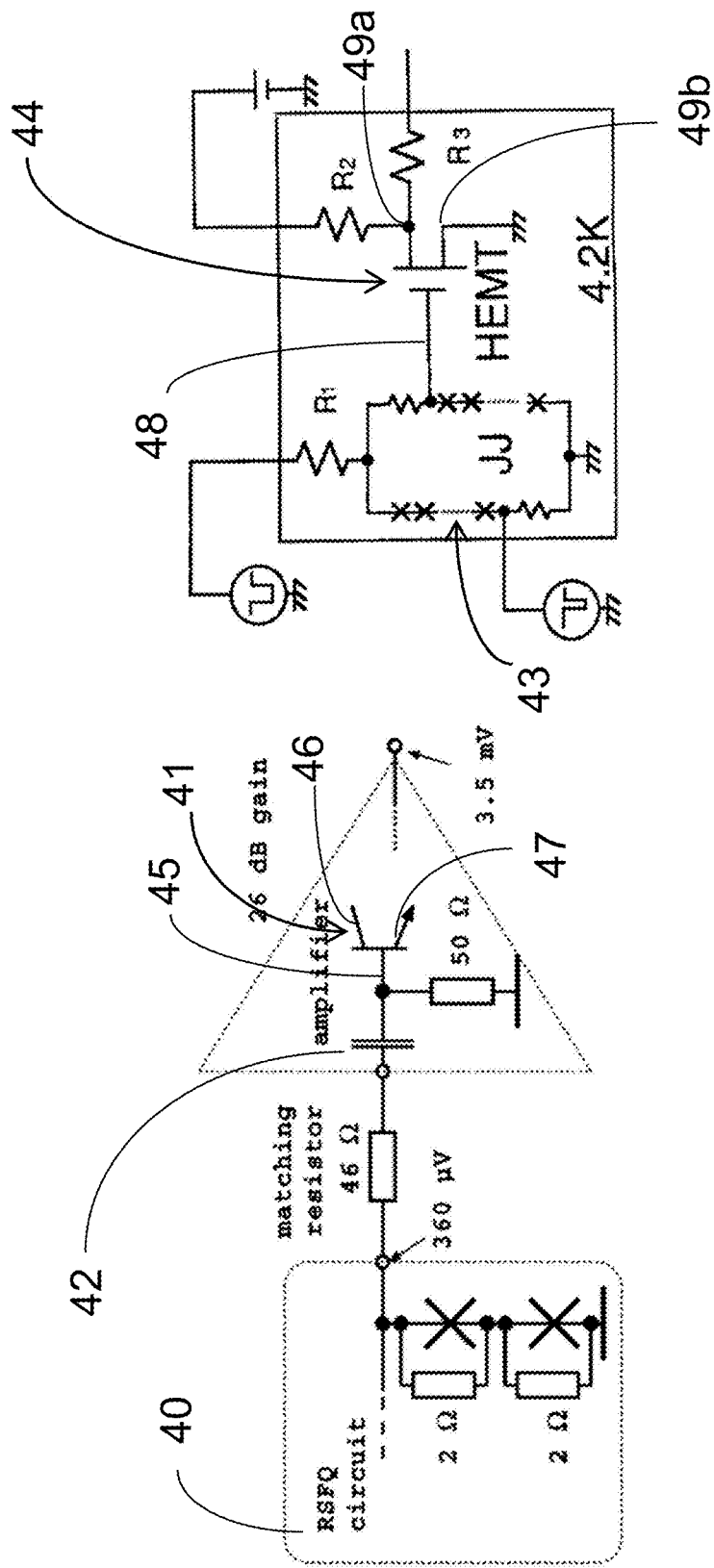
FIGS. 4A and 4B show examples of interconnections between a superconducting driver circuit and the input transistor of a subsequent semiconductor amplifier in accordance with the prior art.

The optical transmitter of the present disclosure includes a light-emitting or light-modulating device (the electro-optic device) and a superconducting driver circuit that controls the modulation of the light produced from the electro-optic device. Prior art superconducting circuits have not been used to drive or control a light-emitting or light-modulating electro-optic device. However, a prior art superconducting circuit that might be used to drive an electro-optic device likely would connect that device in the position of the load of the superconducting circuit, similar to the connections made in the prior art to the base-emitter junction of a bipolar transistor or to the gate of a field-effect transistor, as shown in FIGS. 4A and 4B, respectively. For these prior art configurations, one end of the load is connected to the voltage output port of the superconducting driver and the other end of the load is connected to a common or ground point that also is the common or ground point of the superconducting circuit.

In contrast to the prior art, the present disclosure connects one end of the electro-optic device to the voltage output of the superconducting driver circuit. However, instead of connecting the other end of the electro-optic device to the common or ground point, the other end of the electro-optic device is connected to a bias source, which may be a direct current DC bias source, that is electrically separate from the bias source for the driver circuit.

An example of the superconducting driver circuit that can be used is a set of series-connected Josephson junctions. These series-connected Josephson junctions may be in a dual-parallel configuration commonly known as a Suzuki stack. Another example of a superconducting driver circuit that can be used is a series-connected set (or stack) of superconducting quantum-interference devices (SQUIDs), each having a loop with two Josephson junctions. Other known configurations of Josephson junction based voltage amplifiers or drivers also can also be used for the disclosed optical transmitter.

In a preferred embodiment of the disclosed optical transmitter, the electrical current that passes through the light-emitting or light-modulating device also passes through the set of Josephson junctions (e.g. the Suzuki stack or SQUID stack). That electrical current is supplied from a separate bias source, being conducted through the electro-optic device and through the Suzuki stack or SQUID stack to the common or ground point of the overall circuit. When an input signal representative of a logic 1 is supplied to the driver, the output of that driver switches to a high-voltage state. Thus, the voltage dropped across the EO device is reduced, because more of the DC bias voltage for the EO device is dropped now across the driver stack. As a consequence, the current through the EO device is reduced greatly and the light emitted by a light-emitting diode (LED) or laser is correspondingly reduced. This results in an inverted optical output waveform from the LED or laser. However, if the electro-optical (EO) device is an electro-absorption modulator, reducing the voltage across the EO device increases the transmission of the externally supplied light through the modulator. Thus, an electro-absorption modulator produces a non-inverted optical output waveform.

In another embodiment of the disclosed optical transmitter, the AC bias (or DC bias) waveform produced by a bias circuit of the superconducting driver circuit includes an electrical current. Part of that electrical current passes through the set of Josephson junctions in the Suzuki stack (or SQUID stack) and another part of that electrical current passes from the voltage output port of the Suzuki stack (or SQUID stack) through the electro-optic device and to the separate DC bias source. The configuration of this embodiment is similar to a more standard configuration in which a device is connected as a load at the output point of the driver circuit. The main difference is that the other end of the EO device is connected not to the common or ground of the driver circuit but rather is connected to a separate DC bias source, which is then referenced to the common or ground.

The superconducting circuit of the disclosed optical transmitter controls, and modulates, the relative amount of current that is passed through that electro-optic device and thereby the amount of light produced from that electro-optic device. The magnitude of the voltage swing at the output port of the superconducting driver is smaller than the magnitude of the voltage applied by the separate DC bias source of the EO device. For a Suzuki-stack driver, a different bias source provides an input AC bias waveform that is coupled to both the Suzuki stack and also to the electro-optic device. An input waveform, typically a set of narrow pulses from a single-flux quantum (SFQ) superconducting circuit, is supplied to the Suzuki stack and, in combination with the AC bias waveform, controls the operation of the Suzuki stack. For the SQUID stack driver, a DC source for that driver circuit, which is different from the bias source for the EO device, provides a bias voltage that is coupled to both the stack of SQUIDs and also to the electro-optic device. Two input waveforms comprising SFQ pulses are supplied to and control the stack of SQUIDs through a SFQ-to-dc converting RS flip flop and some Josephson transmission line current amplifiers.

Figure 5:
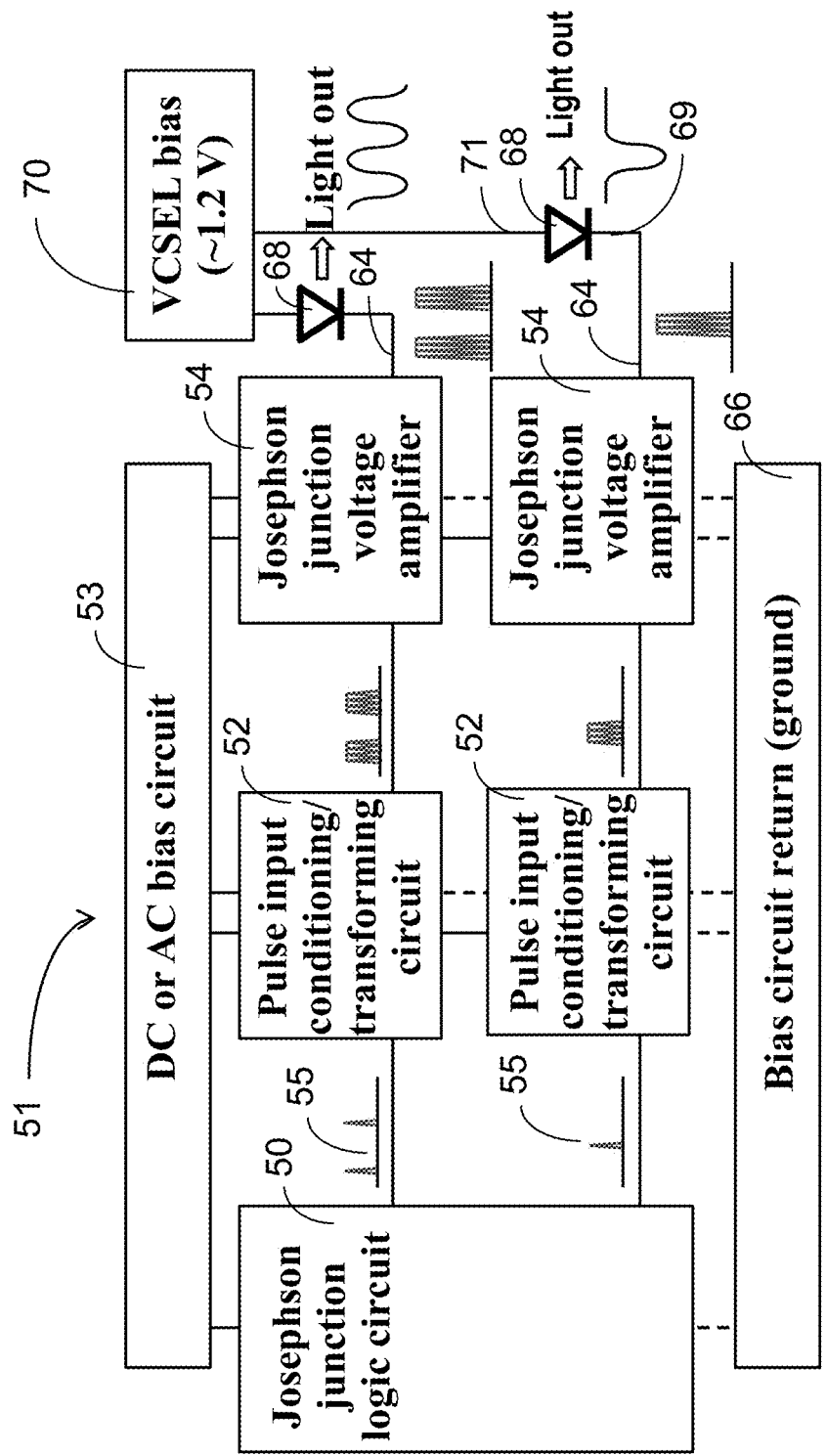
FIG. 5 shows an example of two optical transmitters having a Josephson junction voltage amplifier/driver and an electro-optic light emitter coupled to a superconducting logic circuit in accordance with the present disclosure.

FIG. 5 shows an example of an optical transmitter 51 that has a Josephson-junction based superconducting driver circuit 54, which in this example is a voltage amplifier, and an electro-optic device 68, which in this example is a vertical cavity surface-emitting laser (VCSEL). The example of FIG. 5 has two voltage amplifiers 54 that each drive a VCSEL 68. The two superconducting driver circuits 54 are coupled to and receive their bias waveforms and DC power from the same set of bias circuits 53. Each superconducting driver circuit 54 receives a pattern of input pulses 55 from a logic circuit 50, which may for example be a Josephson-junction based circuit, such as a circuit that operates on SFQ pulses. The pattern of input pulses 55 may be different for each superconducting driver circuit 54. An optional input pulse conditioning or transforming circuit 52 may be located between the logic circuit 50 and one or more of the superconducting voltage amplifiers 54. An example of such a conditioning circuit is a four-Josephson-junction logic (4JL) gate, as described in Reference [4], above. Another example is a resistive voltage divider followed by a Josephson junction, as described in Reference [1], above. Yet another example is a set/reset SFQ-to-dc converting latch, as described in Reference [6], above. Yet another example is a non-linear current injection device as described in Reference [8], above, which is incorporated herein by reference. Additional control-signal distribution circuits such as a network of Josephson transmission line amplifiers may also be located between the logic circuit 50 and the superconducting voltage amplifiers 54 of the optical transmitter 51.

Figure 6:
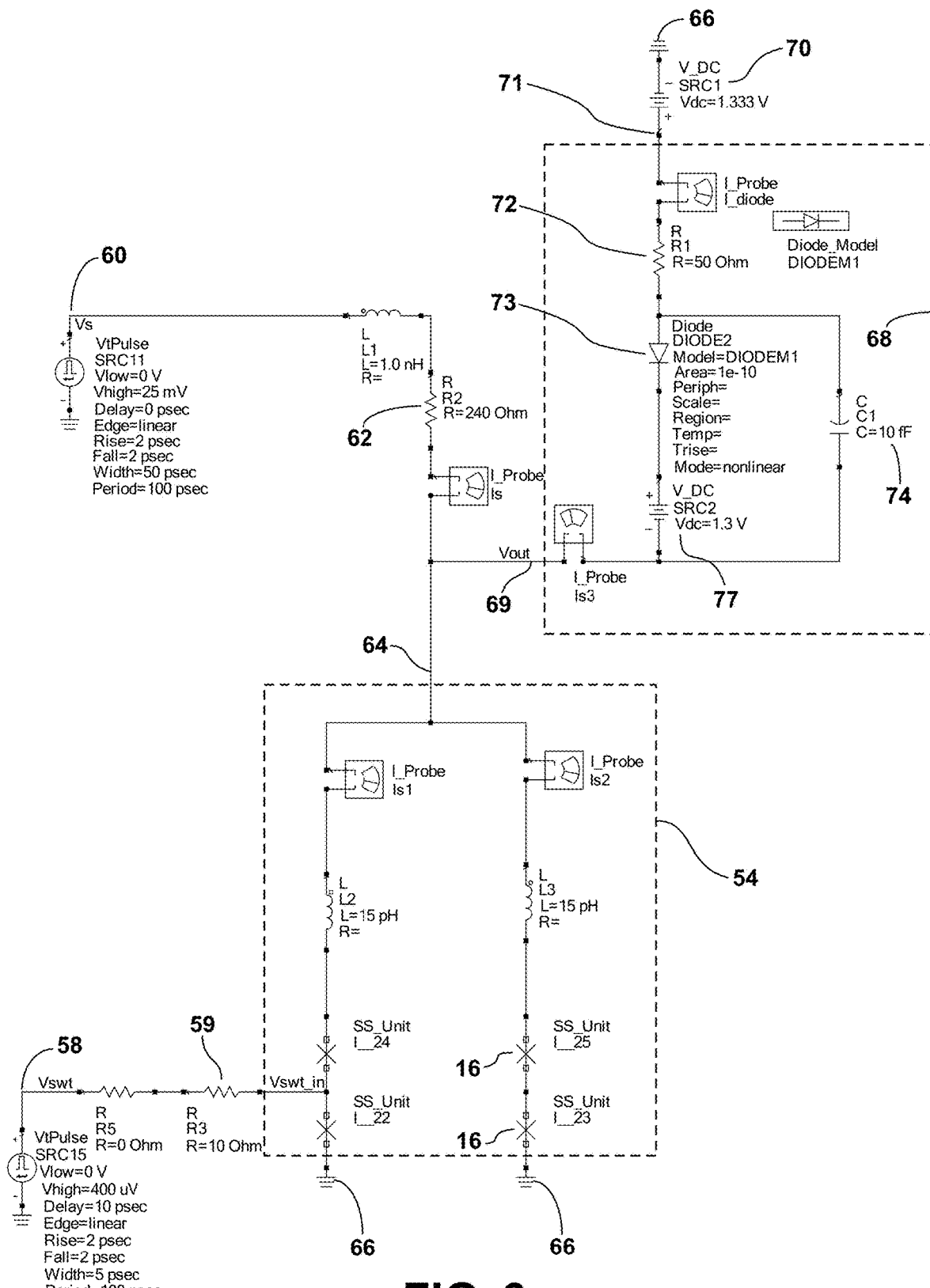
FIG. 6 shows a circuit simulation model for an optical transmitter with a Suzuki stack driver circuit connected to a VCSEL in an inverting configuration in accordance with the present disclosure.

A simple example of a Josephson junction voltage amplifier 54 or driver connected to a light-emitting electro-optic device 68 is shown in FIG. 6. This superconducting driver circuit 54 has two series-connected Josephson junctions 16 in each of the two parallel-configured legs of a Suzuki stack. The control pulses 58 are coupled to the control input of this Suzuki stack 54 through a resistor 59. A periodic (AC) clock waveform 60 supplied from bias source 60 and, serving as the bias waveform for the Suzuki stack, is coupled to the voltage output (Vout) 64 of the Suzuki stack through a bias resistor 62. The Vout output 64 of the Suzuki stack, shown in FIG. 6, is the output port 64 of the voltage amplifier 54, shown in FIG. 5. The bottom end of the Suzuki stack is connected to a circuit ground or common point 66. For this example, the electro-optic device 68 may be a laser diode, a light emitting diode (LED) or a vertical-cavity surface-emitting laser (VCSEL) 68. The cathode 69 (or N-side) of each laser diode 68 is connected to the output port 64 of a voltage amplifier 54. The anode 71 (or P-side) of each laser diode 68 is connected to a DC bias supply 70, which supplies a bias voltage that is positive relative to the ground or circuit-common point 66. Equivalent-circuit parameters important for a model describing the electro-optic device 68 are the current (I) versus voltage (V) characteristic of the intrinsic diode of the device, the series resistance 72 and the parallel capacitance 74. For example, the series resistance 72 may be 50Ω and the parallel capacitance 74 may be 10 fF. In some examples, the intrinsic diode IV characteristic can be described by a series configuration of a non-linear resistance, represented by element 73 and a diode turn-on voltage that can be described by voltage element 77 in the model.

Figure 7A:
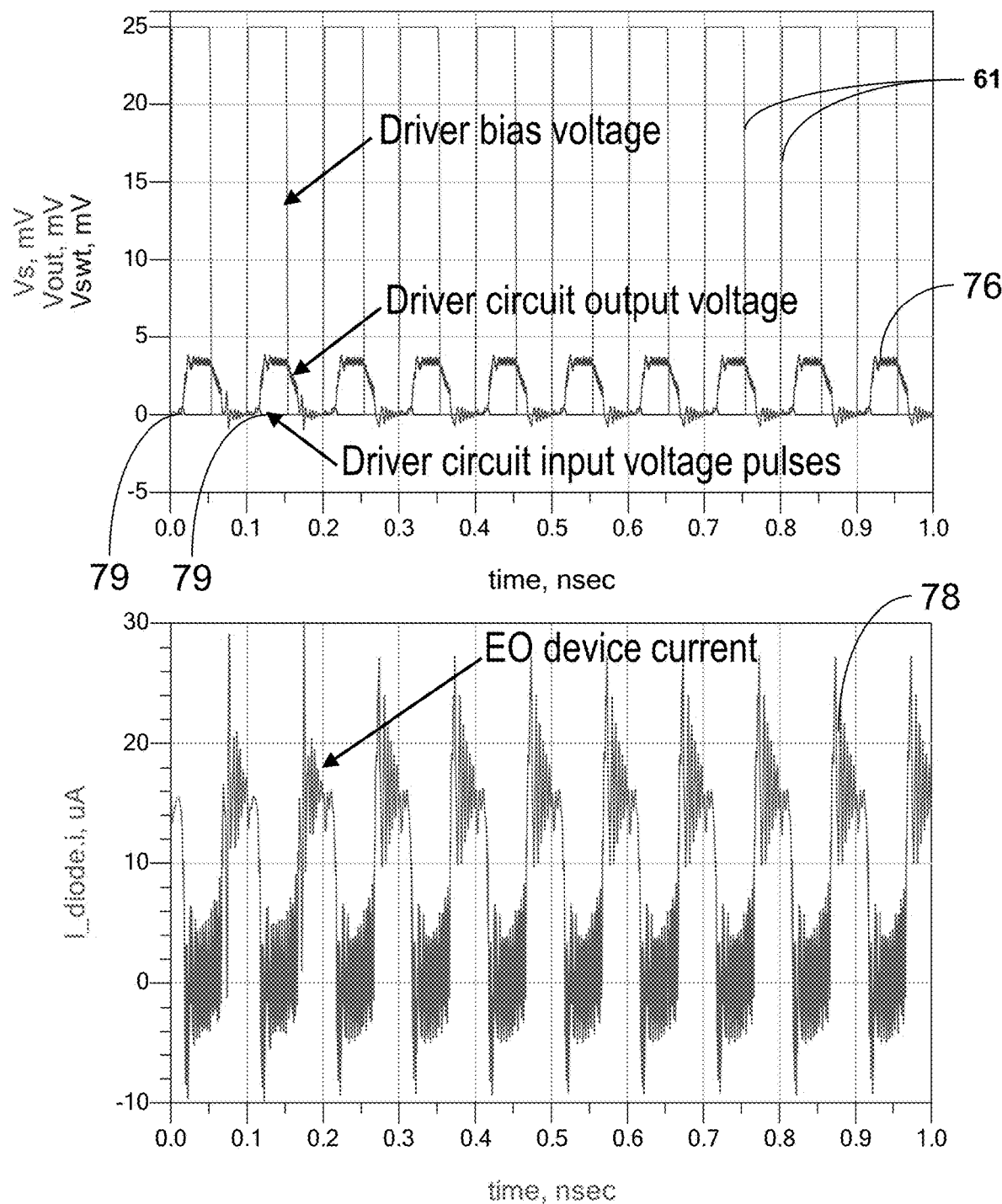
FIGS. 7A and 7B shows example waveforms for the driver output voltage and VCSEL drive current for the configuration of FIG. 6 in accordance with the present disclosure.

FIG. 7A shows the calculated output voltage waveform 76 produced by the driver circuit 54 and the resulting waveform 78 for the current through the electro-optical device. The Suzuki stack driver circuit 54 switches from a logic 0 state to a logic 1 state when a brief input pulse 79, as shown in FIG. 7A, is supplied to the driver circuit 54 while the AC bias current from the bias circuit 53 also is supplied to the driver circuit 54. In this example, bias circuit 53 produces an AC bias voltage waveform 61 associated with the AC bias current, as shown in FIG. 7A.

Figure 7B:
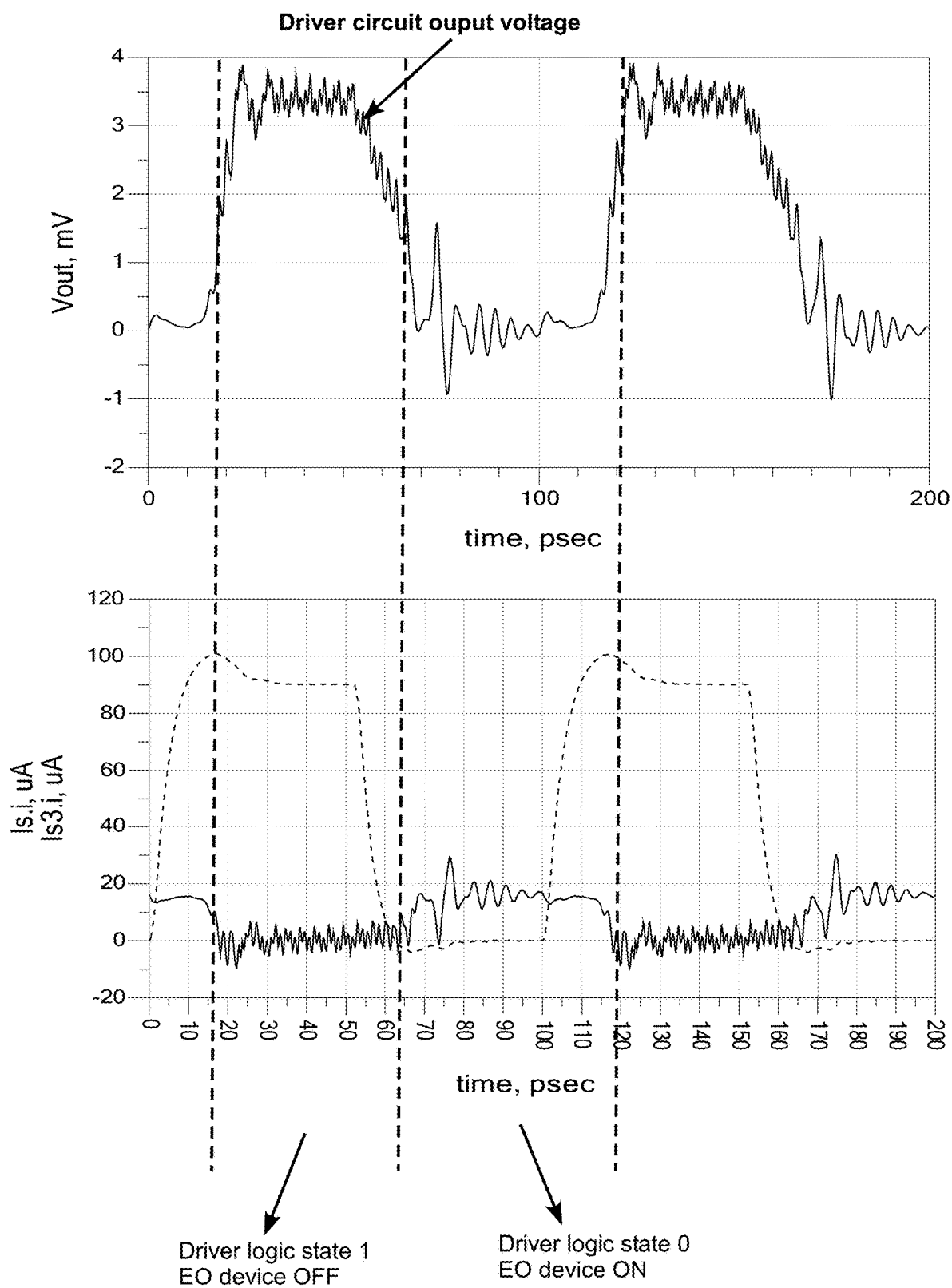

The operation of the optical transmitter of FIGS. 5, 6 and 7 can be understood as follows. Assuming the transmitter is at a logic 1 state of the data, the bias current 60 from the bias circuit 53 flows through the Josephson junctions of the Josephson junction voltage amplifiers 54 with the VCSEL or LED 68 being essentially OFF and therefore emitting negligible light, as illustrated in FIG. 7B. While in the logic 1 state, a significant output voltage, proportional to the product of the inherent voltage of a Josephson junction and the number of series-connected junctions, is produced at the voltage output 64 of the voltage amplifier 54. The separate bias voltage from the bias supply 70 for the VCSEL/LED 68 is selected such that the net voltage across the VCSEL/LED 68 produces an "OFF" current value through the LED 68 or a below lasing-threshold current through the VCSEL 68. Thus, for a logic 1 input to the driver 54, the VCSEL/LED 68 emits negligible light, which is representative of a logic 0, inverted, output.

Alternatively, for a logic 0 output of the driver 54, Josephson junctions 16 in the Suzuki stack are in their superconducting state. Thus, the voltage at the output point 64 of the driver 54 is close to the circuit-ground 66. Thus, there is a substantial net voltage across the VCSEL/LED 68, which, based on the series resistance, differential resistance and turn-on voltage of the VCSEL/LED 68, produces an "ON" current value and produces a desired above lasing-threshold current through the VCSEL/LED 68 so that the VCSEL/LED 68 is in an "ON" state and emits light.

Figures 8A, 8B:
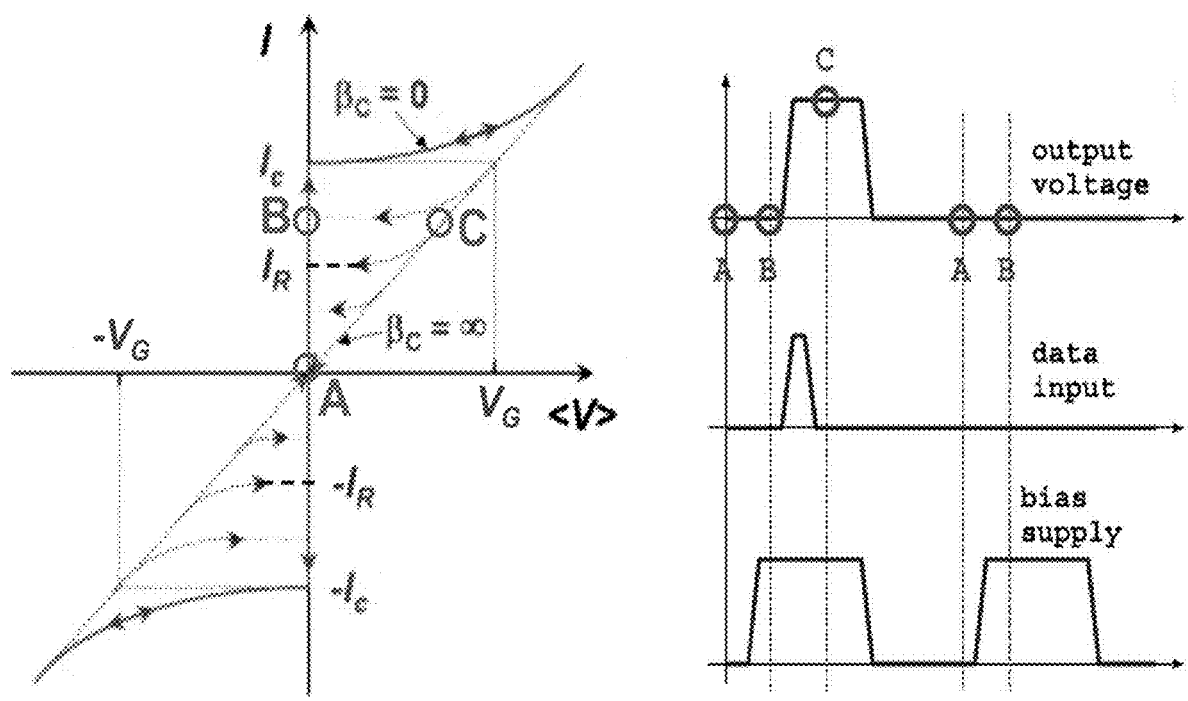
FIGS. 8A and 8B show the switching behavior of a Josephson junction in a driver circuit in accordance with the present disclosure.

FIGS. 8A and 8B illustrate the switching behavior of a Josephson junction in the driver circuit 54. FIG. 8A shows current vs voltage (I vs V) characteristics for an overdamped junction, $\beta_c \approx 0$, an underdamped junction, $\beta_c \approx \infty$, and a junction with intermediate damping, where $\beta_c$ is the Stewart-McCumber parameter that describes the dynamic behavior of a Josephson junction. FIG. 8B shows points A, B and C that correspond to points A, B and C in FIG. 8A. To switch from a logic 0 state to a logic 1 state, the Josephson junction bias current in the superconducting (logic 0) state should be high enough and sufficiently close to the critical current $I_C$ that the additional current supplied by the input data pulse can cause the controlling Josephson junction of the circuit to switch to a resistive state (logic 1), with the voltage across the junction determined by its gap voltage $V_G$. To switch back to a superconducting state (logic 0), the current through the Josephson junction should be below a reset value $I_R$ that is determined by the damping condition of the Josephson junction. This might occur, for example, when both the bias current and the input pulse are removed. However, the current through the VCSEL/LED 68 might be present and be flowing through the Josephson junction when the junction is switching back to a superconducting state. After being switched to a logic 0 state, the bias circuit 53 can again apply a bias current to the driver circuit 54. While in a logic 0 state, both the current from the bias circuit 53 for the driver 54 and the VCSEL/LED 68 current flow through the sets of Josephson junctions in the driver circuit. However, since the VCSEL/LED current is so small compared to the normal bias current of the Suzuki stack, the additional VCSEL/LED current is well within the operating margin of the Suzuki stack. This "ON" current of the VCSEL/LED flows when the Josephson junctions in the driver 54 are in their superconducting state and thus does not contribute much additional energy dissipation. When the Josephson junctions are in their resistive state (and the driver 54 has a more linear output response), the VCSEL/LED 68 is "OFF" and adds close to zero current through the driver circuit 54, again not contributing much additional energy dissipation. Thus, the total energy dissipation of the integrated transmitter module is essentially the energy dissipation of the driver circuit 54, whose voltage output is connected to an open circuit, plus the energy consumption of the VCSEL/LED 68 by itself, connected only to ground through its bias supply 70.

Figure 9A:
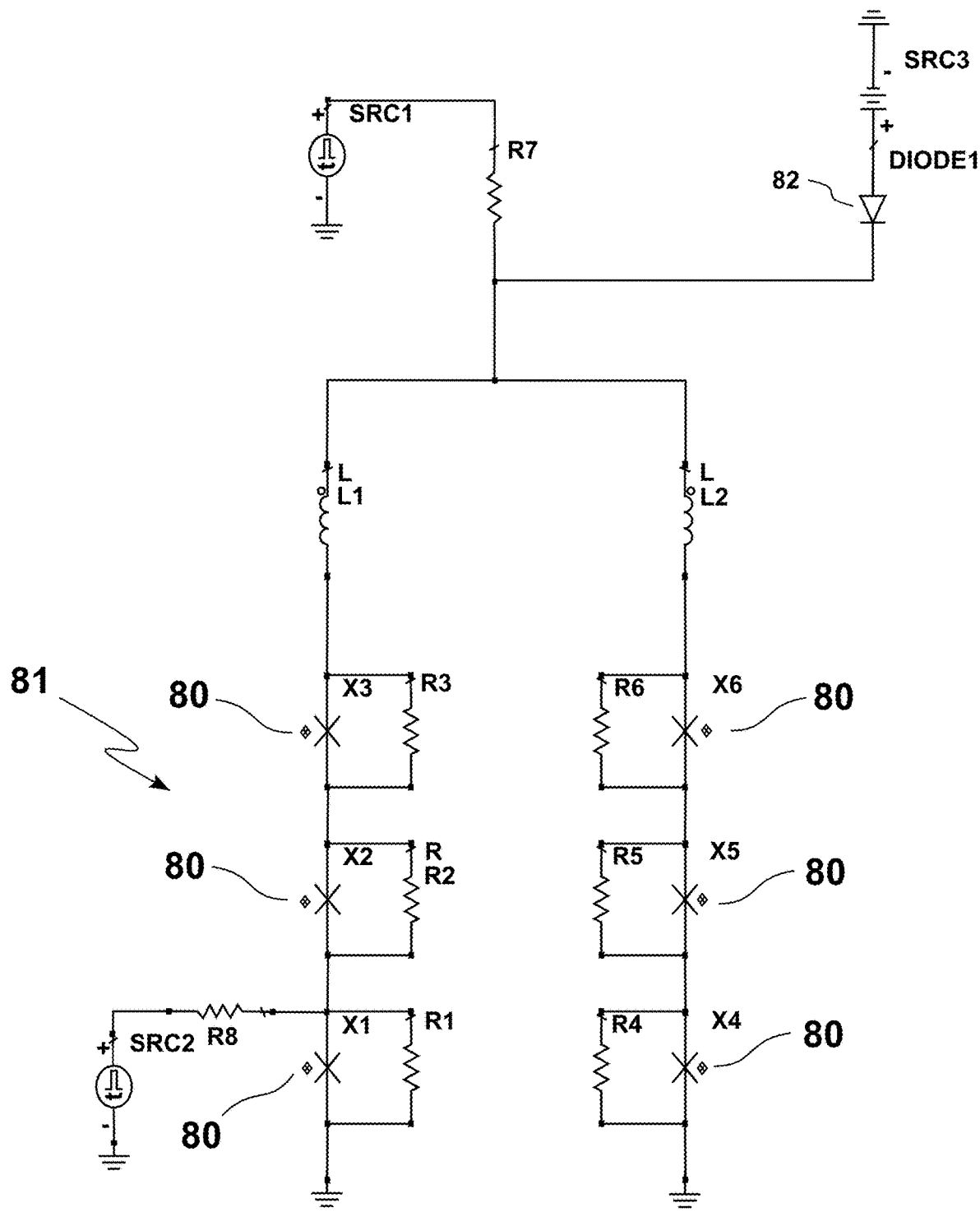
FIGS. 9A and 9B show an inverting configuration of a light emitting diode (LED) driven by a Suzuki stack voltage amplifier and corresponding waveforms in accordance with the present disclosure.
Figure 9B:
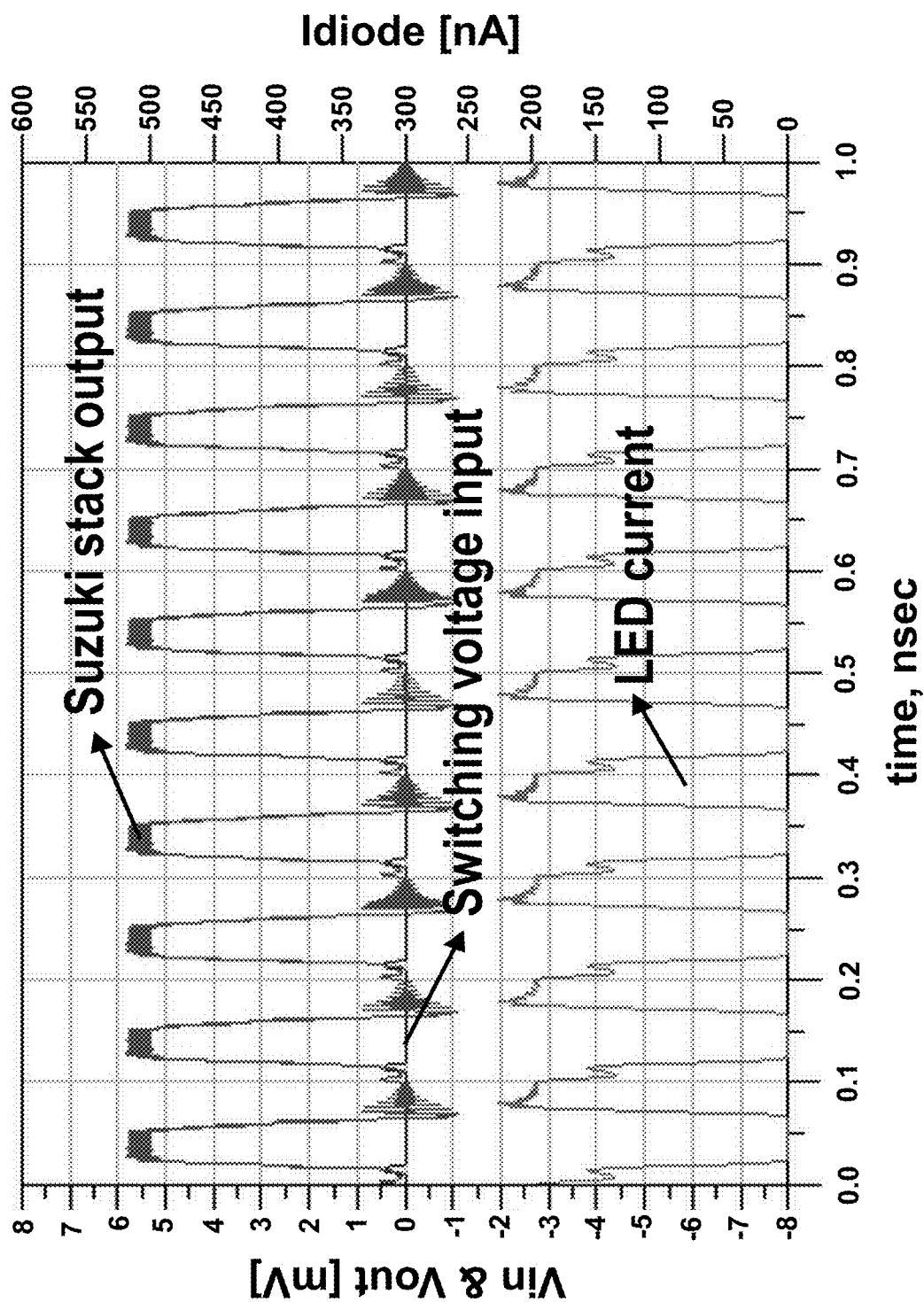

FIG. 9A shows another example of an optical transmitter whose voltage amplifier (driver) circuit 81 has three series-connected Josephson junctions 80 in each leg of a Suzuki stack. For this example, the EO device is a light emitting diode (LED) 82 that requires very low drive current. Note that for the circuit of FIG. 9A, having the additional Josephson junction in each leg (as compared to the circuit of FIG. 6) increases the bias voltage swing produced across the LED 82. The 0.2 µA current swing of the LED 82, shown in FIG. 9B, is much smaller than the 45 µA bias current of this Suzuki stack. The design of the voltage amplifier 81 can be adjusted to accommodate the drive current need of the EO device 82.

Figure 10A:
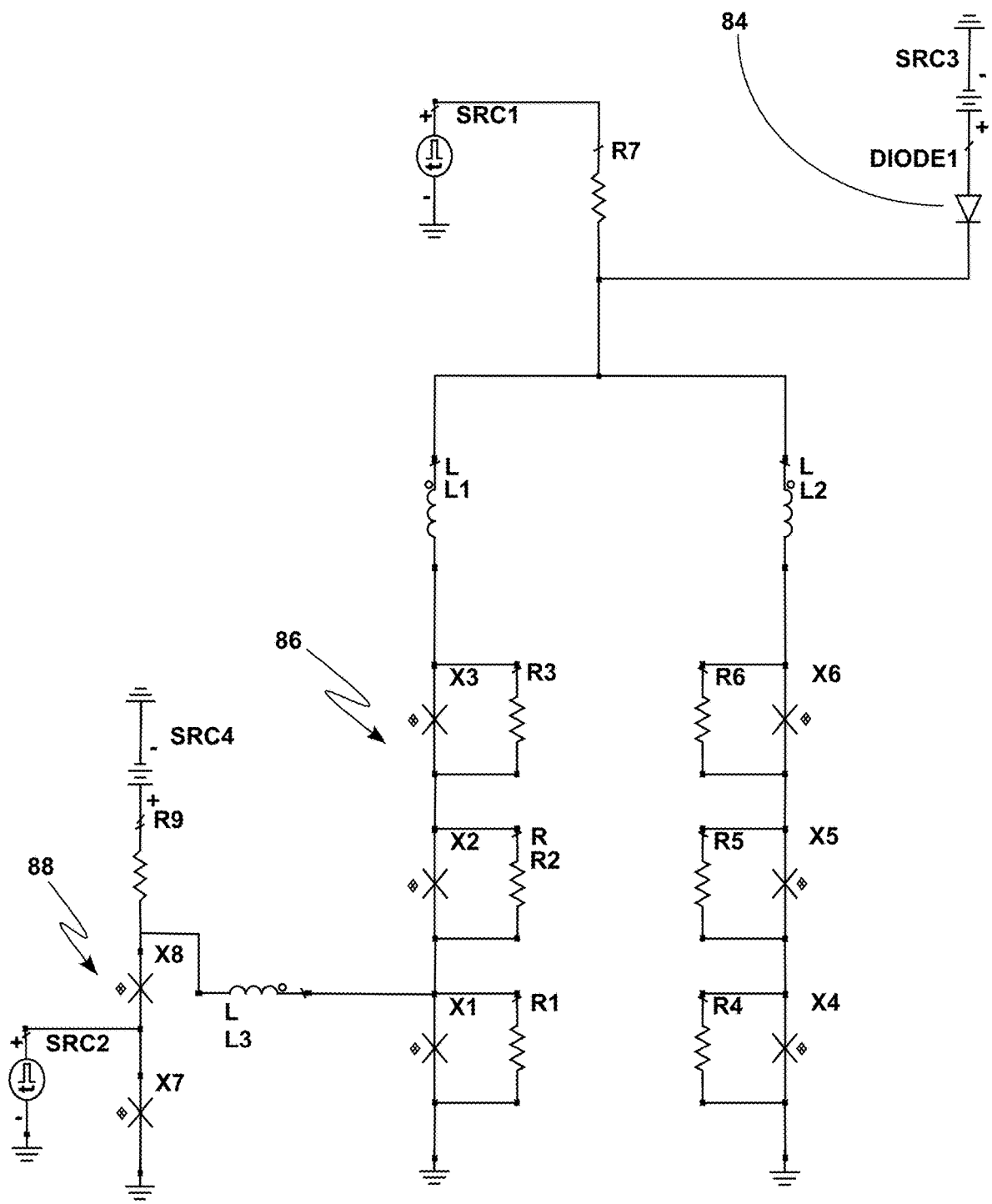
FIGS. 10A and 10B show an example optical transmitter with a JTL input conditioning circuit followed by a Suzuki stack driving an LED and corresponding waveforms in accordance with the present disclosure.
Figure 10B:
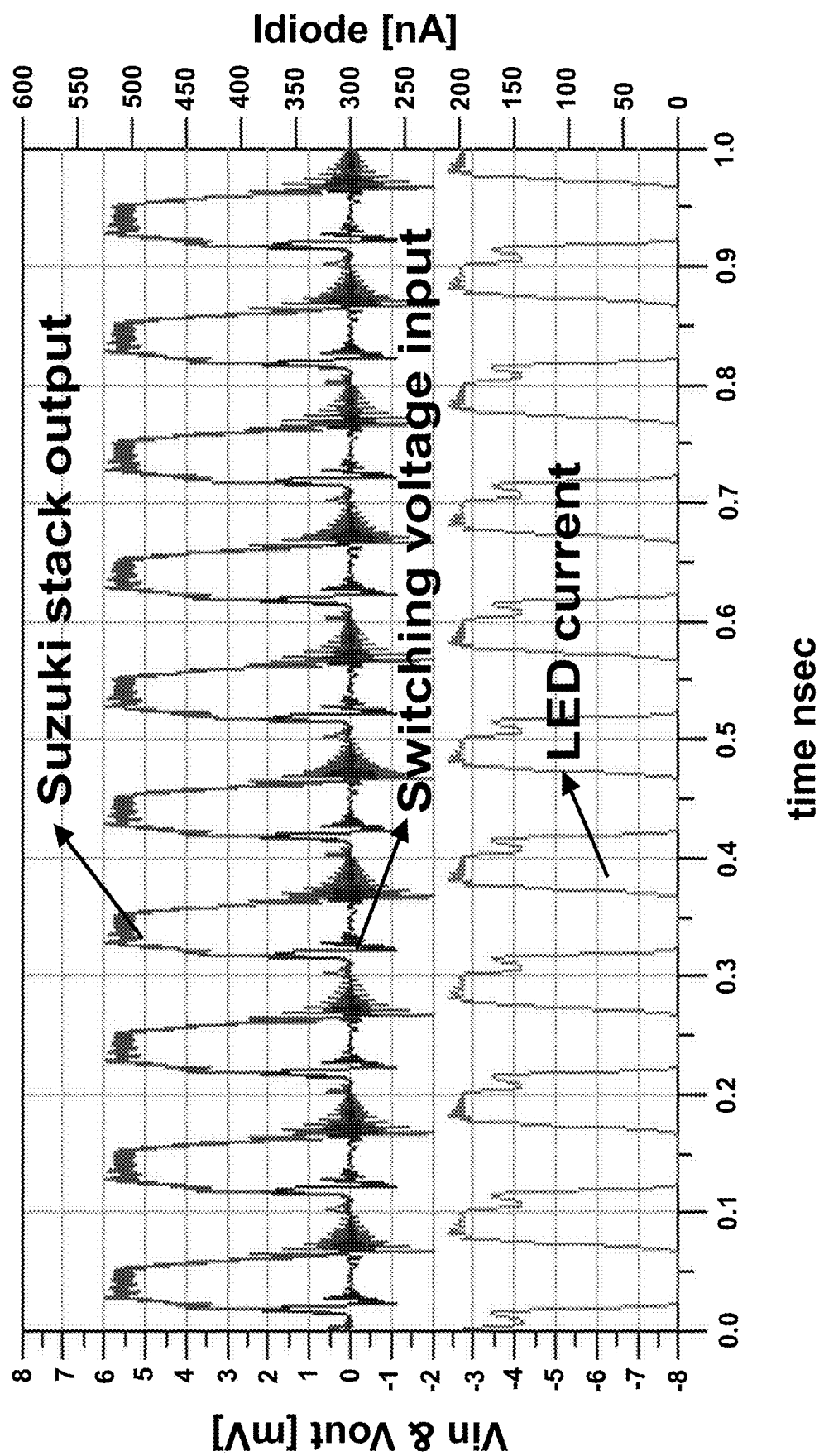

FIG. 10A shows an example of an LED 84 driven by a 3-series-connected Josephson junction Suzuki stack 86 that is preceded by a Josephson transmission line (JTL) 88. The control signal input provided by the JTL has more "ringing", as shown in the waveforms in FIG. 10B, than the input assumed for the example of FIG. 9A. Nevertheless, the voltage waveform and current waveform supplied to the LED 84 still are of high quality. For both of the examples depicted in FIGS. 9 and 10, the LEDs 82 and 84 are driven in an inverting manner, with the LEDs being supplied non-negligible drive currents and thus producing output light when the Suzuki stack is in its logic 0 state.

Figure 11:
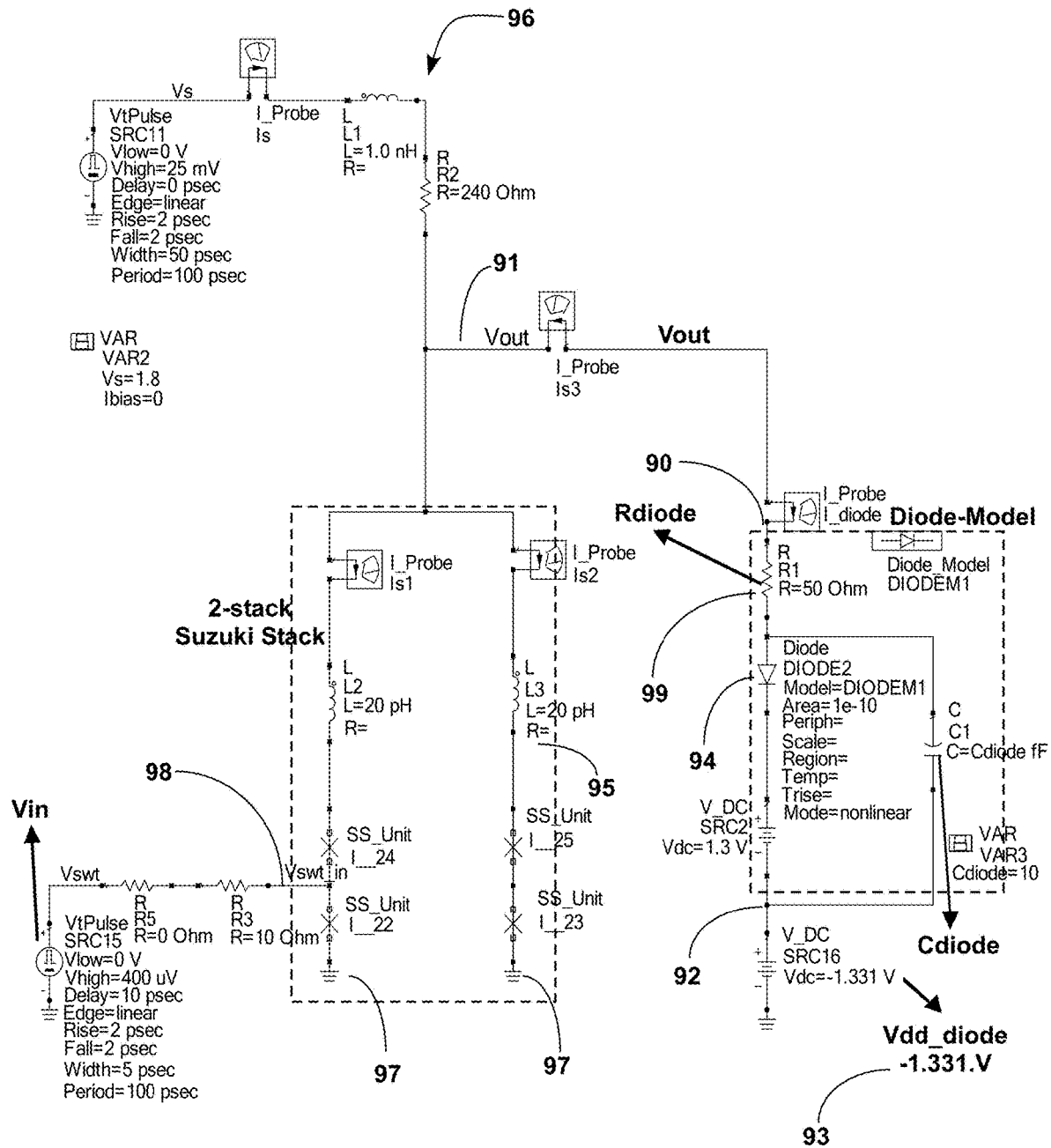
FIG. 11 shows a circuit simulation model of an optical transmitter with a non-inverting configuration of a VCSEL driven by a Suzuki-stack voltage amplifier in accordance with the present disclosure.
Figure 12:
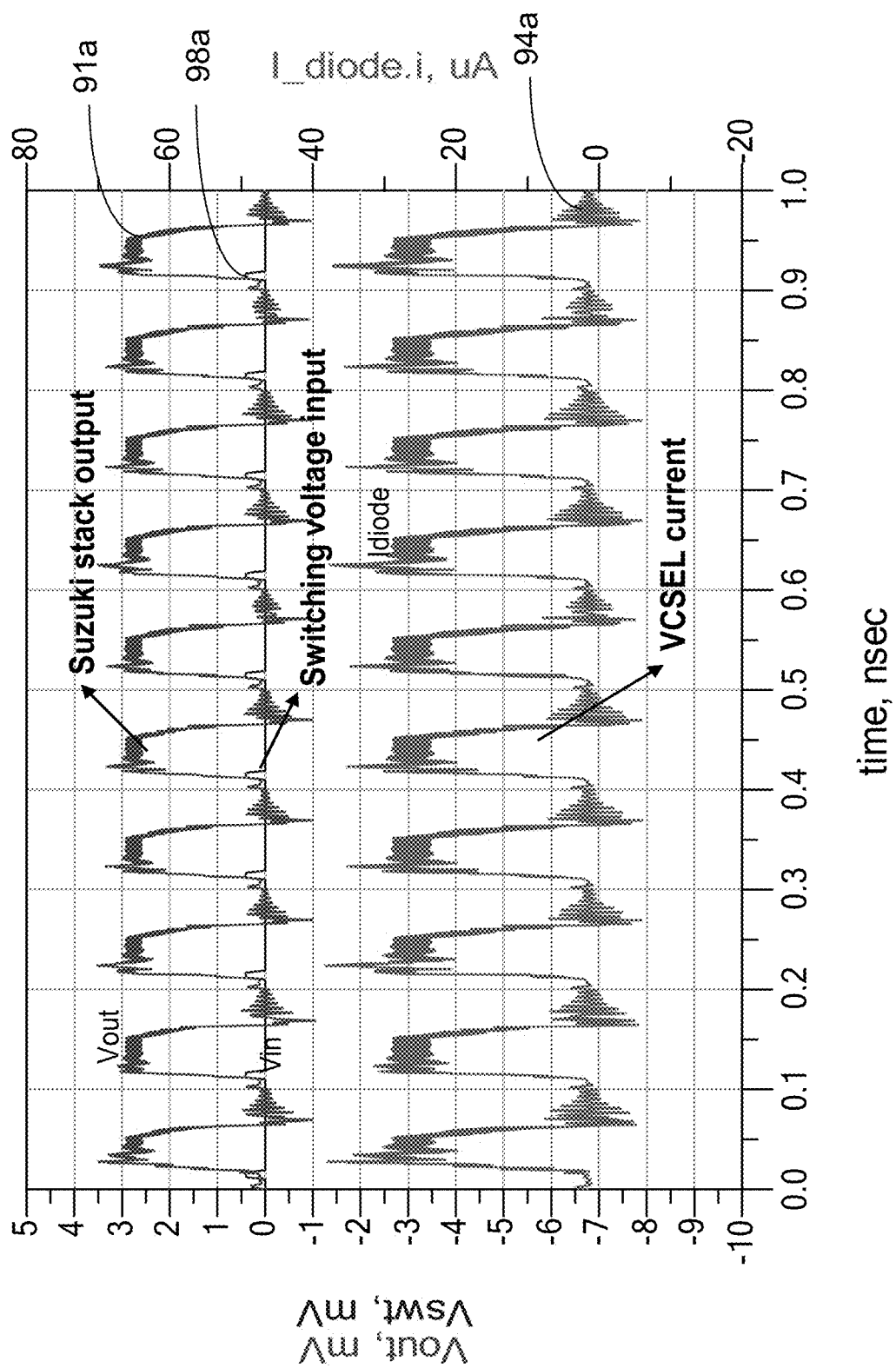
FIG. 12 shows waveforms of input voltage pulses and a Suzuki stack output in accordance with the present disclosure.

An alternative configuration of the optical transmitter, shown in FIG. 11, connects the anode 90 (P-side) of the electro-optic diode device 94 to the voltage output (Vout) 91 of the voltage amplifier 95. The cathode 92 (N-side) of the EO device 94 is connected to a EO-device bias source 93 that produces a DC bias voltage that is a negative voltage relative to the common ground 97 of the voltage amplifier 95. In this configuration, when the Suzuki stack of the voltage amplifier 95 is in its logic 1 state, the Josephson junctions in the Suzuki stack are in a resistive state, and a high voltage is produced at the voltage output (Vout) 91 of the driver circuit 95. Like the configurations illustrated in FIGS. 6-10, the Suzuki stack in voltage amplifier 95 switches to its logic 1 state when both a bias current from the bias source 96 and an input current pulse is supplied to it through driver circuit input 98. FIG. 12 shows examples of the waveforms for the voltage 91a at Vout 91, the input voltage 98a corresponding to input current pulses at drive circuit input 98, and the VCSEL current 94a through EO device 94. For the configuration of FIG. 11, the negative DC bias voltage produced by source 93 is such that current is supplied to the EO device 94, which may for example be a VCSEL or LED, when the Suzuki stack is in its logic 1 state and the Josephson junctions are in a resistive state. Because light is emitted when the superconducting voltage amplifier 95 is in a logic 1 state, this configuration is considered a non-inverting transmitter. The VCSEL drive current is supplied from the bias source 96 of the superconducting driver circuit 95 through the bias resistance 99, and through the VCSEL or LED 94 to the negative DC bias source 93. Thus, in the logic 1 state the VCSEL or LED 94 is "ON" and emits light.

When the bias current from the bias source 96 is removed or turned OFF, with the voltage (relative to the common or ground potential) produced by source 96 being approximately zero, the Josephson junctions in the superconducting voltage amplifier 95 are put in a superconducting state and the voltage at output Vout 91 of the Suzuki stack becomes essentially zero. Thus, the net voltage across the VCSEL or LED 94 is no longer sufficient to exceed the needed "turn on" voltage of the VCSEL or LED. The VCSEL current is then below its lasing threshold current and the light output from the VCSEL/LED 94 is diminished and becomes negligible. While in this logic 0 state, the Josephson junctions of the Suzuki stack shunt to circuit ground 97 the bias current supplied by the bias source 96 when that bias source is turned ON. The driver circuit 95 can be put again into a logic 1 state by supplying an input current pulse through input 98 while bias current is being supplied from bias source 96.

Figure 13A:
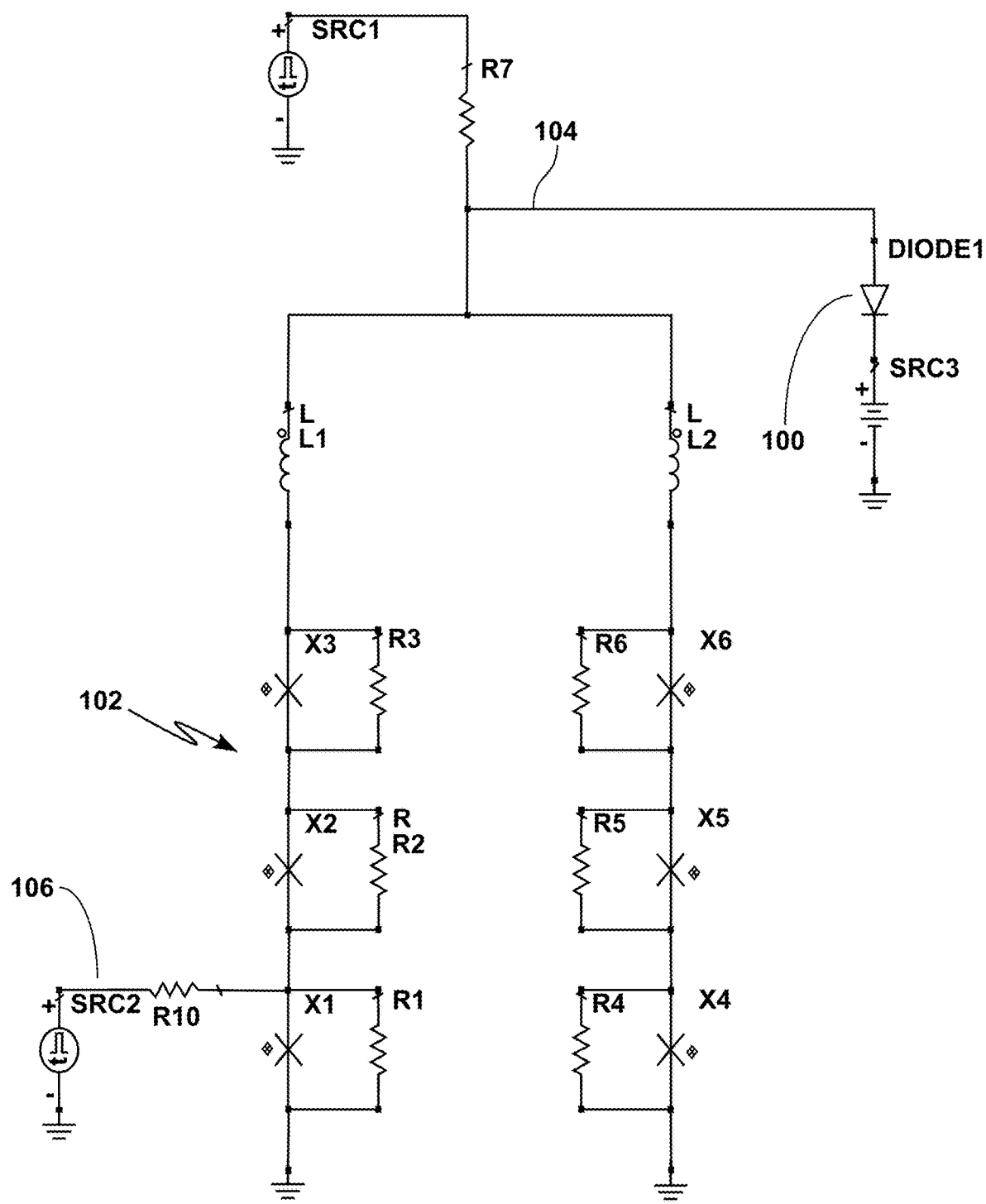
FIGS. 13A and 13B show another example of an electro-optic (EO) light-emitting device, an LED, that is driven in a non-inverting configuration and corresponding waveforms in accordance with the present disclosure.
Figure 13B:
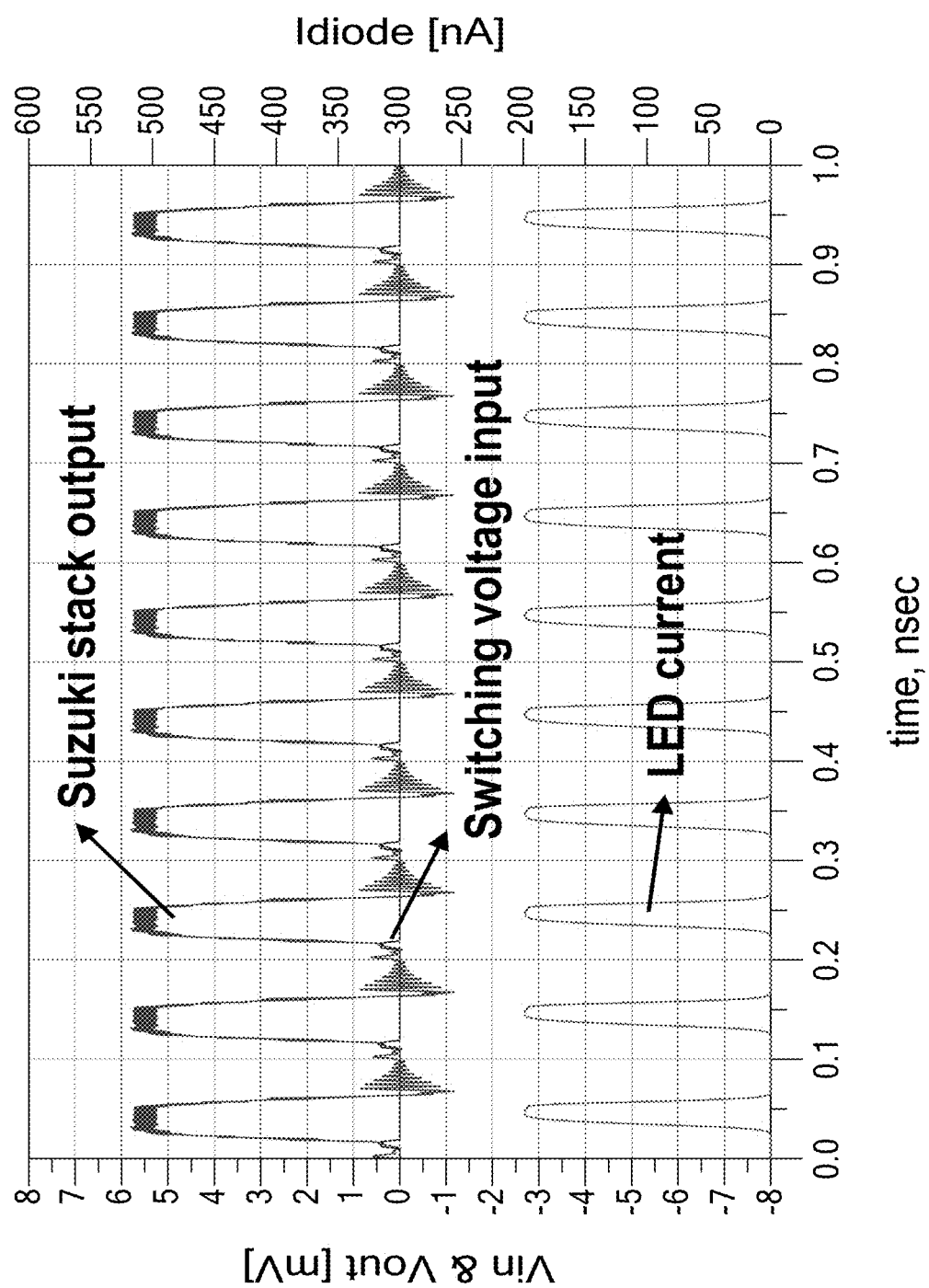

FIG. 13A shows another example of an EO light-emitting device, which in this example is an LED 100, which is driven in a non-inverting configuration. The Suzuki stack voltage amplifier 102 of this example has three series-connected Josephson junctions in each of its two parallel legs. The LED 100 receives substantial drive current and thus produces output light when the voltage at output 104 from the Suzuki stack is sufficiently large, >5 mV in this example. The voltage at output 104 of the driver 102, as shown in FIG. 13B, reaches a high voltage shortly after an input pulse 106a is supplied to input 106 of the Suzuki stack. Note that the clock waveform must be supplying current to the Suzuki stack when the input pulse is present for the voltage amplifier to switch to its logic 1 state and have a high-voltage output.

Figure 14A:
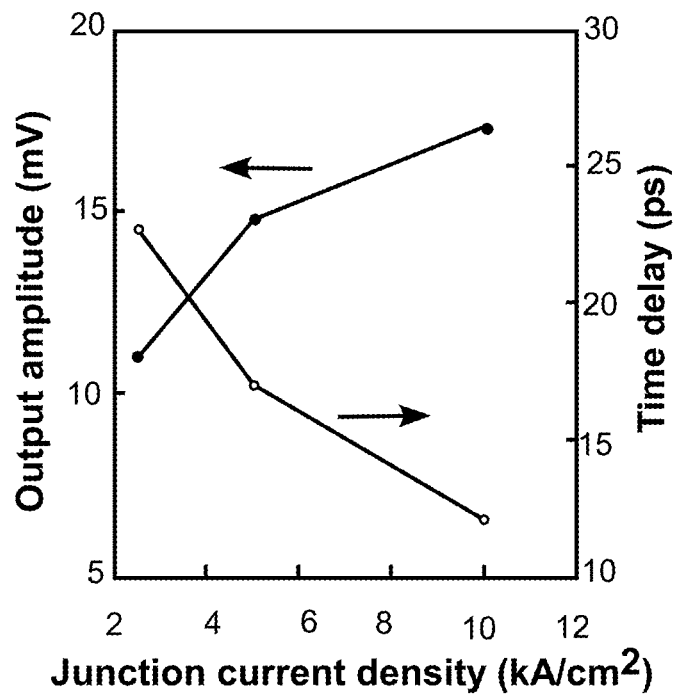
FIG. 14A shows a dependence of output voltage and response time on current density in a Josephson junction.
Figure 14B:
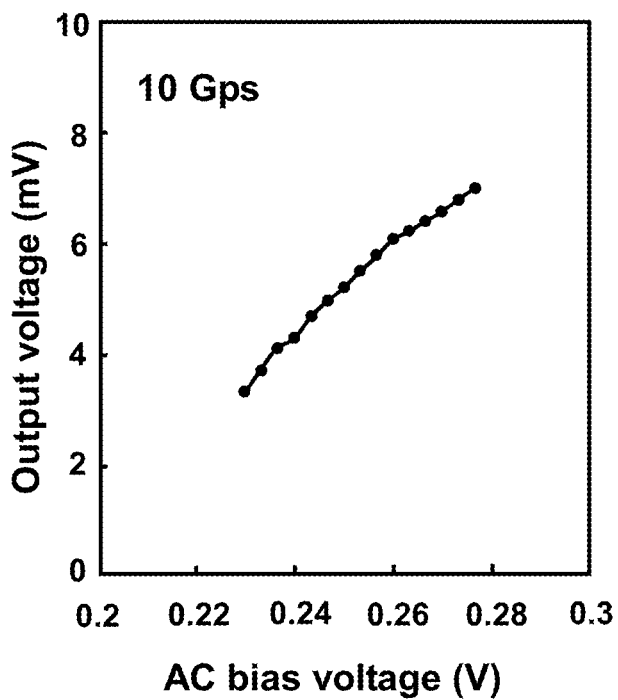
FIG. 14B shows a dependence of output voltage on bias voltage of the Suzuki stack amplifier in accordance with the present disclosure.

The voltage amplifier design can be adjusted to produce larger or smaller output voltage swings and a faster or slower response, as desired for a given application. For example, FIG. 14A shows that for a given number of series-connected Josephson junctions in a stacked amplifier, the output voltage can be increased by increasing the current density through the Josephson junctions, as described by Reference [1], above. The response speed also can be increased by increasing the current density. Another way to increase the output voltage swing, for a given number of series-connected junctions, is to increase the magnitude of the AC bias voltage waveform, as described by Reference [1], above, and as illustrated in FIG. 14B. For the examples shown in FIG. 14, the increase in output voltage swing is achieved with an accompanying increase in the overall power consumption, since the relative increase in required junction current density or AC bias voltage exceeds the achieved increase in output voltage swing.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. An optical transmitter comprising:
   a superconducting driver circuit comprising at least one Josephson junction, the superconducting driver circuit having a voltage output and having a connection to a circuit ground;
   a first bias circuit coupled to the voltage output of the superconducting driver circuit;
   a second bias circuit, wherein the second bias circuit establishes a positive bias voltage relative to the circuit ground; and an electro-optic device having a first end and a second end;
wherein the first end of the electro-optic device is coupled to the voltage output of the superconducting driver circuit; and
wherein the second end of the electro-optic device is coupled to the second bias circuit.

2. The optical transmitter of claim 1:
wherein the electro-optic device comprises a light emitting diode, a laser diode, or a vertical-cavity surface-emitting laser (VCSEL).

3. The optical transmitter of claim 1:
wherein the first end of the electro-optic device comprises a cathode of the electro-optic device; and
wherein the second end of the electro-optic device comprises an anode of the electro-optic device.

4. The optical transmitter of claim 1:
wherein when the superconducting driver circuit is in a superconducting state, current flows from the second bias circuit through the electro-optic device and through the at least one Josephson junction in the superconducting driver circuit; and
wherein when the superconducting driver circuit is in a resistive state, negligible or no current flows from the second bias circuit through the electro-optic device and through the at least one Josephson junction in the superconducting driver circuit.

5. The optical transmitter of claim 1:
wherein the positive bias voltage relative to the circuit ground is such that when the at least one Josephson junction in the superconducting driver circuit is in a superconducting state, the electro-optic device is in an ON state and emits light; and
wherein the positive bias voltage relative to the circuit ground is such that when the at least one Josephson junction in the superconducting driver circuit is in a resistive state, the electro-optic device is in an OFF state and emits negligible or no light.

6. The optical transmitter of claim 1 further comprising:
a logic circuit coupled to the superconducting driver circuit for supplying input pulses to the superconducting driver circuit.

7. The optical transmitter of claim 6 further comprising:
an input pulse conditioning circuit coupled between the logic circuit and the superconducting driver circuit for conditioning the input pulses.

8. The optical transmitter of claim 7 wherein the input pulse conditioning circuit comprises:
a four-Josephson-junction logic gate; or
a resistive voltage divider followed by a Josephson junction; or
a set/reset SFQ-to-dc converting latch; or
a non-linear current injection device; or
a network of Josephson transmission line amplifiers.

9. The optical transmitter of claim 1 wherein the first end of the electro-optic device is coupled directly to the voltage output of the superconducting driver circuit such that a direct current can flow from the second bias circuit through the electro-optic device and through at least one Josephson junction of the superconducting driver circuit.

10. The optical transmitter of claim 4 wherein the first bias circuit supplies a first current that flows through at least one Josephson junction of the superconducting driver circuit and
wherein the sum of the first current and the current that flows from the second bias circuit through the electro-optic device and through at least one Josephson junction of the superconducting driver circuit has a value that is below a critical current of the at least one Josephson junction of the superconducting driver circuit.

11. The optical transmitter of claim 4 wherein the first bias circuit supplies a first current across at least one Josephson junction of the superconducting driver circuit and
wherein the sum of the first current and an input pulse supplied to the superconducting driver circuit has a value that is above a critical current of the at least one Josephson junction of the superconducting driver circuit.

12. An optical transmitter comprising:
a superconducting driver circuit comprising at least one Josephson junction, the superconducting driver circuit having a voltage output and having a connection to a circuit ground;
a first bias circuit coupled to the voltage output of the superconducting driver circuit;
a second bias circuit, wherein the second bias circuit establishes a negative bias voltage relative to the circuit ground; and
an electro-optic device having a first end and a second end;
wherein the first end of the electro-optic device is coupled to the voltage output of the superconducting driver circuit; and
wherein the second end of the electro-optic device is coupled to the second bias circuit.

13. The optical transmitter of claim 12:
wherein the electro-optic device comprises a light emitting diode, a laser diode, or a vertical-cavity surface-emitting laser (VCSEL).

14. The optical transmitter of claim 12:
wherein the first end of the electro-optic device comprises an anode of the electro-optic device; and
wherein the second end of the electro-optic device comprises a cathode of the electro-optic device.

15. The optical transmitter of claim 12:
wherein when the superconducting driver circuit is in a resistive state, current flows through the electro-optic device to the second bias circuit.

16. The optical transmitter of claim 12:
wherein the negative bias voltage relative to the circuit ground is such that when the at least one Josephson junction in the superconducting driver circuit is in a resistive state, the electro-optic device is in an ON state and emits light; and
wherein the negative bias voltage relative to the circuit ground is such that when the at least one Josephson junction in the superconducting driver circuit is in a superconducting state, the electro-optic device is in an OFF state and emits negligible or no light.

17. The optical transmitter of claim 12 further comprising:
a logic circuit coupled to the superconducting driver circuit for supplying input pulses to the superconducting driver circuit.

18. The optical transmitter of claim 17 further comprising:
an input pulse conditioning circuit coupled between the logic circuit and the superconducting driver circuit for conditioning the input pulses.

19. The optical transmitter of claim 18 wherein the input pulse conditioning circuit comprises:
a four-Josephson-junction logic gate; or
a resistive voltage divider followed by a Josephson junction; or
a set/reset SFQ-to-dc converting latch; or
a non-linear current injection device; or
a network of Josephson transmission line amplifiers.

20. The optical transmitter of claim 12 wherein
the first bias circuit supplies a first bias current such that when the superconducting driver circuit is in a resistive state, the electro-optic device is in an ON state and emits light and when the superconducting driver circuit is in a superconducting state, the electro-optic device is in an OFF state and emits negligible or no light,
and the first bias circuit supplies a second bias current such that when the superconducting driver circuit is in a resistive state, the superconducting driver circuit can be brought into a superconducting state.

21. The optical transmitter of claim 12:
wherein when the superconducting driver circuit is in a resistive state, direct current flows from the first bias circuit through the electro-optic device and through the second bias circuit; and
wherein when the superconducting driver circuit is in a superconducting state, direct current flows from the first bias circuit through the at least one Josephson junction in the superconducting driver circuit and the voltage output is such that a net voltage between the voltage output and the negative bias voltage established by the second bias circuit is not sufficient to exceed a turn on voltage of the electro-optic device.

22. A method of providing an optical transmitter comprising:
providing a superconducting driver circuit comprising at least one Josephson junction, the superconducting driver circuit having a voltage output and having a connection to a circuit ground;
providing a first bias circuit coupled to the voltage output of the superconducting driver circuit;
providing a second bias circuit; and
providing an electro-optic device having a first end and a second end;
wherein the first end of the electro-optic device is coupled to the voltage output of the superconducting driver circuit; and
wherein the second end of the electro-optic device is coupled to the second bias circuit.

23. The method of claim 22:
wherein the first end of the electro-optic device comprises a cathode of the electro-optic device;
wherein the second end of the electro-optic device comprises an anode of the electro-optic device;
wherein the second bias circuit produces a positive bias voltage relative to the circuit ground;
wherein when the superconducting driver circuit is in a superconducting state, direct current flows from the second bias circuit through the electro-optic device and through the at least one Josephson junction in the superconducting driver circuit;
wherein the positive bias voltage relative to the circuit ground is such that when the at least one Josephson junction in the superconducting driver circuit is in a resistive state, the electro-optic device is in an OFF state and emits negligible or no light; and
wherein the positive bias voltage relative to the circuit ground is such that when the at least one Josephson junction in the superconducting driver circuit is in a superconducting state, the electro-optic device is in an ON state and emits light.

24. The method of claim 22:
wherein the first end of the electro-optic device comprises an anode of the electro-optic device;
wherein the second end of the electro-optic device comprises a cathode of the electro-optic device;
wherein the second bias circuit produces a negative bias voltage relative to the circuit ground;
wherein when the superconducting driver circuit is in a resistive state, direct current flows through the electro-optic device to the second bias circuit;
wherein the negative bias voltage relative to the circuit ground is such that when the at least one Josephson junction in the superconducting driver circuit is in a resistive state, the electro-optic device is in an ON state and emits light; and
wherein the negative bias voltage relative to the circuit ground is such that when the at least one Josephson junction in the superconducting driver circuit is in a superconducting state, the electro-optic device is in an OFF state and emits negligible or no light.

25. The method of claim 22 further comprising:
providing a logic circuit coupled to the superconducting driver circuit for supplying input pulses to the superconducting driver circuit.

26. The method of claim 25 further comprising:
providing an input pulse conditioning circuit coupled between the logic circuit and the superconducting driver circuit for conditioning the input pulses.

27. The method of claim 26 wherein the input pulse conditioning circuit comprises:
a four-Josephson-junction logic gate; or
a resistive voltage divider followed by a Josephson junction; or
a set/reset SFQ-to-dc converting latch; or
a non-linear current injection device; or
a network of Josephson transmission line amplifiers.

* * * * *